US007263343B2

(12) United States Patent
Mitsunaka et al.

(10) Patent No.: US 7,263,343 B2
(45) Date of Patent: Aug. 28, 2007

(54) FREQUENCY CONVERTER AND RADIO COMMUNICATION DEVICE USING SAME

(75) Inventors: Takeshi Mitsunaka, Soraku-gun (JP); Masayuki Miyamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 308 days.

(21) Appl. No.: 10/922,556

(22) Filed: Aug. 19, 2004

(65) Prior Publication Data
US 2005/0043000 A1 Feb. 24, 2005

(30) Foreign Application Priority Data

| Aug. 20, 2003 | (JP) | ............................. 2003-296937 |
| Aug. 20, 2003 | (JP) | ............................. 2003-296939 |
| Jun. 3, 2004 | (JP) | ............................. 2004-165879 |
| Jun. 4, 2004 | (JP) | ............................. 2004-167099 |

(51) Int. Cl.
*H04B 1/18* (2006.01)
(52) U.S. Cl. ....................... 455/292; 455/326; 455/333
(58) Field of Classification Search ................ 455/280, 455/292, 313–314, 323, 326, 333; 327/113
See application file for complete search history.

(56) References Cited

U.S. PATENT DOCUMENTS

| 5,003,622 A | * | 3/1991 | Ma et al. ..................... 455/327 |
| 5,027,163 A | * | 6/1991 | Dobrovolny ................. 455/326 |
| 5,125,111 A | * | 6/1992 | Trinh .......................... 455/327 |
| 5,448,772 A | | 9/1995 | Grandfield |
| 6,351,502 B1 | | 2/2002 | Zargari |
| 6,711,395 B1 | * | 3/2004 | Tonegawa et al. .......... 455/313 |

FOREIGN PATENT DOCUMENTS

JP 2000315919 A * 11/2000

OTHER PUBLICATIONS

Sjöland, H. et al. (Jun. 2003). "A Merged CMOS LNA and Mixer for a WCDMA Receiver," *IEEE Journal of Solid-State Circuits* 38(6): 1045-1049.

* cited by examiner

*Primary Examiner*—Nguyen T. Vo
(74) *Attorney, Agent, or Firm*—Morrison & Foerster LLP

(57) ABSTRACT

A frequency converter that performs dual frequency conversion is provided. The frequency converter restricts noise occurrence and enables signal transfer with good linearity. The frequency converter performs dual conversion of a first signal (RF(+) and RF(−)) by using two signals including a second signal (LO1 (+) and LO1 (−)) and a third signal (LO2 (+) and LO2 (−)). Using a balun and an amplifying circuit that performs input/output operations in a single-ended manner, the frequency converter restricts NF degradation. By feeding optimum values of current into the first and second switching circuits and into the amplifying circuit, NF and linearity are optimized. The balun, the amplifying circuit, and the first and second switching circuits are formed on the same semiconductor substrate.

11 Claims, 20 Drawing Sheets

(A)

(B)

FREQUENCY CONVERTER AND RADIO COMMUNICATION DEVICE USING SAME

This application claims priority under 35 U.S.C. §119(a) on Japanese Patent Application Nos. 2003-296937 filed in Japan on Aug. 20, 2003, 2003-296939 filed in Japan on Aug. 20, 2003, 2004-165879 filed in Japan on Jun. 3, 2004, and 2004-167099 filed in Japan on Jun. 4, 2004, the entire contents of which are hereby incorporated by reference.

BACKGROUND OF THE INVENTION (1) Field of the Invention

The present invention generally relates to frequency converters that perform dual frequency conversion, and more particularly to frequency converters that down-convert an RF (radio frequency) signal to a baseband frequency. The invention also relates to radio communication devices using such frequency converters.

(2) Description of the Prior Art

FIG. 18 is a block diagram of a known terminal unit such as a wireless LAN (Local Area Network) transceiver. Referring to FIG. 18, the wireless LAN transceiver performs frequency conversion of a signal received via an antenna to obtain an intermediate frequency, and amplifies it. The wireless LAN transceiver then performs AD (analog to digital) conversion of the intermediate frequency and demodulates it to extract a digital signal. The present invention relates to frequency converters that perform this frequency conversion.

Presently, known frequency converters of this kind include those receiving circuits that perform dual frequency conversion (e.g., U.S. Pat. No. 5,448,772). FIG. 19 is a circuit diagram of a frequency converter described in the U.S. Pat. No. 5,448,772 specification.

As shown in FIG. 19, a frequency converter 100 includes an amplifying circuit 50 that is made up of transistors Q1 and Q2 and that amplifies a first signal (RF(+), RF(−)), a switching circuit 51 that performs a first frequency conversion by using a second signal (LO1 (+), LO1 (−)), a switching circuit 52 that performs a second frequency conversion by using a third signal (LO2 (+), LO2 (−)), and a switching circuit 53 that performs a second frequency conversion by using a forth signal (LO3 (+), LO3 (−)). The first switching circuit 51 performs the first frequency conversion and supplies a current signal in a divided manner to the switching circuits 52 and 53, which perform the second frequency conversion. The switching circuits 52 and 53 perform the second frequency conversion and output I and Q baseband signals. The output signals are output after converted into voltage signals by output loads 54.

However, the structure of the U.S. Pat. No. 5,448,772 specification has the following problems. Specifically, the amplifying circuit 50 is operated in a differential manner and thus allows twice as many noises to occur as does an amplifying circuit operated in a single-ended manner. Thus, suppression of the entire noise figure (NF) by using an amplifying circuit that requires high gain causes to increase current fed into the frequency converter.

Additionally, since the frequency of the output signal is in the baseband spectrum, 1/f noise increases. Accordingly, when an optimum amount of current is fed into the switching circuit, the amount of current to be fed into the transistor serving as an amplifying circuit falls short and gain falls short as well, resulting in an increase in the entire NF.

Further, the currents to be fed into the switching circuits 51 to 53 and the amplifying circuit 50 have respective optimum values for obtaining gain, NF, and linearity performance. FIG. 20(A) is a graph showing the current (Isw) flowing through the switching circuits 51 to 53 vs. NF, and the current (Isw) vs. third order input intercept point (IIP3) that is indicative of linearity. FIG. 20(B) is a graph showing the current (Igm) flowing through the amplifying circuit 50 vs. NF, and the current (Igm) vs. third order input intercept point (IIP3) that is indicative of linearity. As shown in FIGS. 20(A) and 20(B), the optimum current value for the amplifying circuit 50 and that for the switching circuits 51 to 53 are different. Additionally, in the patent document 1, the current fed into the switching circuit 51 is the sum of the currents in the switching circuits 52 and 53, which means a current of an optimum value is not necessarily fed into the switching circuit 51.

SUMMARY OF THE INVENTION

It is an object of the present invention to provide a frequency converter that is improved so as to restrict noise occurrence.

It is another object of the present invention to provide a frequency converter that enables signal transfer with good linearity.

It is another object of the present invention to provide a frequency converter that is improved so as to reduce current consumption.

It is another object of the present invention to provide a radio communication device that uses such a frequency converter.

In order to solve the foregoing and other problems, there is provided a frequency converter according to a first aspect of the present invention which performs dual frequency conversion of a first signal by using two signals including a second signal and a third signal, the frequency converter comprising: a first switching circuit for performing a first frequency conversion by mixing the first signal and the second signal; a second switching circuit for performing a second frequency conversion by mixing a signal output from the first switching circuit and the third signal; and a balun (balanced-to-unbalanced transformer) having input terminals and output terminals. The output terminals of the balun are coupled to input terminals of the first switching circuit, and the first signal is introduced via the input terminals of the balun.

The first signal is preferably transferred to the first switching circuit in the form of a current signal.

With this structure, both of the differential output terminals of the balun supply the same amounts of current signals and direct currents (hereinafter referred to as DCs) to the first switching circuit.

The balun preferably comprises two inductors alternately formed on a semiconductor substrate, one of the inductors forming an input-side inductor and the other inductor forming an output-side inductor; and the first switching circuit, the second switching circuit, and the balun are preferably formed on the same semiconductor substrate.

A coupling point may be provided at a center of the output-side inductor of the balun, and a current source for supplying current may be coupled to the coupling point. A coupling point may be provided at a center of the output-side inductor of the balun, and the coupling point may be ground.

With this structure, both of the differential output terminals of the balun supply the same amounts of current signals and DCs to the first switching circuit.

A current source may be coupled to each coupling point of the output terminals of the balun and the output terminals of the first switching circuit.

With this structure as well, both of the differential output terminals of the balun supply the same amounts of current signals and DCs to the first switching circuit.

The frequency converter preferably further comprises an amplifier having input terminals and output terminals and performing input/output operations in a single-ended manner. In this case, the output terminals of the amplifier are coupled to the input-side inductor of the balun, and the first signal is introduced via the input terminals of the amplifier.

With this structure, since the amplifier performs input/output operations in a single-ended manner, noise occurrence and current consumption are reduced, as compared with operations in a differential manner.

By providing the current source, it is possible to adjust the amounts of current fed into the second switching circuit to current values optimum for the NF and linearity performance of the second switching circuit. Also, it is possible to adjust the amount of current fed into the first switching circuit to a current value optimum for the NF and linearity of the first switching circuit.

If the frequency with which the first switching circuit deals and the frequency with which the second switching circuit deals are different, the sizes of the transistors forming the first switching circuit and the second switching circuit are preferably selected to be optimum for respective NF and linearity.

According to a second aspect of the invention, there is provided a frequency converter performing dual frequency conversion of a first signal by using two signals including a second signal and a third signal, the frequency converter comprising: a first switching circuit for performing a first frequency conversion by mixing the first signal and the second signal; and a second switching circuit for performing a second frequency conversion by mixing a signal output from the first switching circuit and the third signal. A current source and output terminals of an amplifying circuit for amplifying the first signal are coupled to input terminals of the first switching circuit.

In this case, the current source is preferably formed of transistors. Bias voltage application means for applying a bias voltage to each base of the transistors forming the current source is provided, and the bias voltage is adjustable. The current source may be formed of a tank circuit including inductors and capacitors. In this case, the output terminals of the differential amplifying circuit may be coupled to the input terminals of the first switching circuit via DC-cutting capacitors.

With this structure, the current fed into the first switching circuit is set to a current value optimum for reducing noise occurrence.

According to a third aspect of the invention, there is provided a frequency converter performing dual frequency conversion of a first signal by using two signals including a second signal and a third signal and performing dual frequency conversion of the first signal by using two signals including the second signal and a fourth signal, the frequency converter comprising: a first switching circuit for performing a first frequency conversion by mixing the first signal and the second signal; a second switching circuit for performing a second frequency conversion by mixing a signal output from the first switching circuit and the third signal; a third switching circuit for performing a second frequency conversion by mixing the signal output from the first switching circuit and the fourth signal; and a balun having input terminals and output terminals. The output terminals of the balun are coupled to input terminals of the first switching circuit, and the first signal is introduced via the input terminals of the balun.

The first signal is preferably transferred to the first switching circuit in the form of a current signal. The balun preferably comprises two inductors alternately formed on a semiconductor substrate, one of the inductors forming an input-side inductor and the other inductor forming an output-side inductor.

With this structure, both of the differential output terminals of the balun supply the same amounts of current signals and direct currents (hereinafter referred to as DCs) to the first switching circuit.

A coupling point may be provided at a center of the output-side inductor of the balun, and a current source for supplying current may be coupled to the coupling point, or the coupling point may be ground.

With this structure, both of the differential output terminals of the balun supply the same amounts of current signals and DCs to the first switching circuit.

A current source for supplying current may be provided at each coupling point of both output terminals of the balun and the input terminals of the first switching circuit.

With this structure as well, both of the differential output terminals of the balun supply the same amounts of current signals and DCs to the first switching circuit.

The frequency converter preferably further comprises a low-noise amplifier having input terminals and output terminals and performing input/output operations in a single-ended manner, and the output terminals of the low-noise amplifier are preferably coupled to the input-side inductor of the balun. In this case, the first signal is introduced via the input terminals of the low-noise amplifier.

With this structure, since the amplifier performs input/output operations in a single-ended manner, noise occurrence and current consumption are reduced, as compared with operations in a differential manner.

A current source is preferably coupled to each coupling point of the first switching circuit and the second switching circuit and to each coupling point of the first switching circuit and the third switching circuit. The current source is preferably formed of a transistor.

With this structure, it is possible to adjust the amounts of current fed into the second and third switching circuits to current values optimum for the NF and linearity of the second and third switching circuits. Also, it is possible to adjust the amount of current fed into the first switching circuit to a current value optimum for the NF and linearity of the first switching circuit.

If the frequency with which the first switching circuit deals and the frequency with which the second and third switching circuits deal are different, the sizes of the transistors forming the first switching circuit, the second switching circuit, and the third switching circuit are preferably selected to be optimum for respective NF and linearity.

According to a fourth aspect of the invention, there is provided a frequency converter performing dual frequency conversion of a first signal by using two signals including a second signal and a third signal and performing dual frequency conversion of the first signal by using two signals including the second signal and a fourth signal, the frequency converter comprising: a first switching circuit for performing a first frequency conversion by mixing the first signal and the second signal; a second switching circuit for performing a second frequency conversion by mixing a signal output from the first switching circuit and the third signal; and a third switching circuit for performing a second frequency conversion by mixing the signal output from the first switching circuit and the fourth signal. Differential transistors serving as an amplifying circuit for amplifying the first signal and a current source for supplying current are coupled to input terminals of the first switching circuit.

In this case, the current source is preferably formed of transistors. Bias voltage application means for applying a bias voltage to each base of the transistors forming the current source is provided, and the bias voltage is adjustable. The current source may be formed of a tank circuit including inductors and capacitors.

With this structure, the current fed into the first switching circuit is set to a current value optimum for reducing noise occurrence.

A radio communication device according to a fifth aspect of the present invention comprises: an antenna; and a frequency converter for performing dual frequency conversion of a first signal received via the antenna, the dual frequency conversion performed by using two signals including a second signal and a third signal. The frequency converter comprises: a first switching circuit for performing a first frequency conversion by mixing the first signal and the second signal; a second switching circuit for performing a second frequency conversion by mixing a signal output from the first switching circuit and the third signal; and a balun having input terminals and output terminals. The output terminals of the balun are coupled to input terminals of the first switching circuit, and the first signal is introduced via the input terminals of the balun.

A radio communication device according to a sixth aspect of the present invention comprises: an antenna; and a frequency converter for performing dual frequency conversion of a first signal received via the antenna, the dual frequency conversion performed by using two signals including a second signal and a third signal. The frequency converter comprises: a first switching circuit for performing a first frequency conversion by mixing the first signal and the second signal; and a second switching circuit for performing a second frequency conversion by mixing a signal output from the first switching circuit and the third signal. A current source and output terminals of an amplifying circuit for amplifying the first signal are coupled to input terminals of the first switching circuit.

A radio communication device according to a seventh aspect of the present invention comprises: an antenna; and a frequency converter for performing dual frequency conversion of a first signal received via the antenna, the dual frequency conversion performed by using two signals including a second signal and a third signal and by using two signals including the second signal and a fourth signal. The frequency converter comprises: a first switching circuit for performing a first frequency conversion by mixing the first signal and the second signal; a second switching circuit for performing a second frequency conversion by mixing a signal output from the first switching circuit and the third signal; a third switching circuit for performing a second frequency conversion by mixing the signal output from the first switching circuit and the fourth signal; and a balun having input terminals and output terminals. The output terminals of the balun are coupled to input terminals of the first switching circuit, and the first signal is introduced via the input terminals of the balun.

A radio communication device according to an eighth aspect of the present invention comprises: an antenna; and a frequency converter performing dual frequency conversion of a first signal received via the antenna, the dual frequency conversion performed by using two signals including a second signal and a third signal and by using two signals including the second signal and a fourth signal. The frequency converter comprises: a first switching circuit for performing a first frequency conversion by mixing the first signal and the second signal; a second switching circuit for performing a second frequency conversion by mixing a signal output from the first switching circuit and the third signal; and a third switching circuit for performing a second frequency conversion by mixing the signal output from the first switching circuit and the fourth signal. Differential transistor serving as an amplifying circuit for amplifying the first signal and a current source for supplying current are coupled to input terminals of the first switching circuit.

DESCRIPTION OF THE PREFERRED EMBODIMENTS

Preferred embodiments of the present invention will now be described.

The following is an example of the present invention applied to a frequency converter that performs dual conversion to down-convert an RF signal to a baseband frequency.

Figure 1:
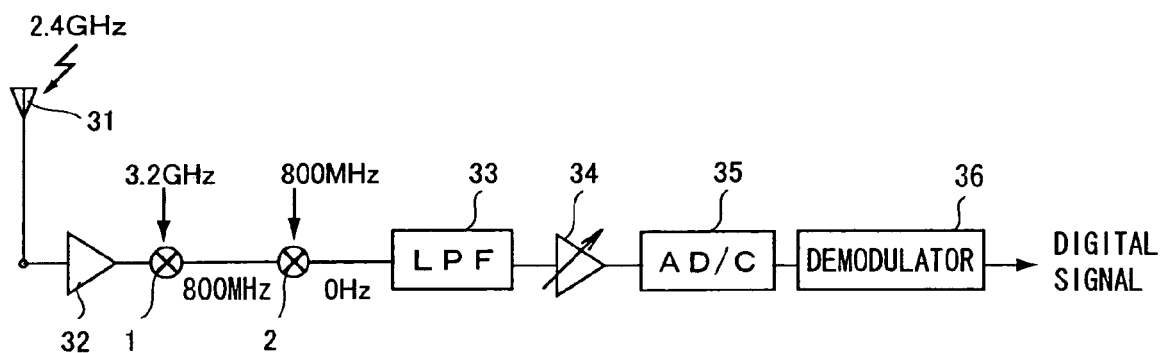
FIG. 1 is a block diagram of a terminal device of a wireless LAN transceiver that uses a frequency converter according to the present invention.

FIG. 1 is a block diagram of a terminal device of a wireless LAN transceiver that uses a frequency converter according to the present invention. Referring to FIG. 1, a first signal (of, for example, 2.4 GHz) received via an antenna 31 is amplified in a low-noise amplifier (LNA) 32 and then transferred to a first switching circuit 1 in the form of, for example, a current signal.

The first switching circuit 1 performs a first frequency conversion by mixing the first signal and a second signal (of, for example, 3.2 GHz), thus converting the first signal down to 800 MHz, which is the difference of the first and second signals. The first switching circuit 1 supplies the resulting signal to a second switching circuit 2 in the form of a current signal.

The second switching circuit 2 performs a second frequency conversion by mixing the received signal and a signal of, for example, 800 MHz, thus generating a signal of a baseband frequency in a vicinity of 0 Hz, which is the difference of the received signal and the 800 MHz signal. The generated baseband frequency signal passes through a low-pass filter 33 and is amplified in a variable gain amplifier (VGA) 34. The signal then passes through an AD (analog-digital) converter (AD/C) 35 and a demodulator 36, and is extracted as a digital signal.

Embodiments of this invention will be described in more detail referring to drawings.

Embodiment 1

Figure 2:
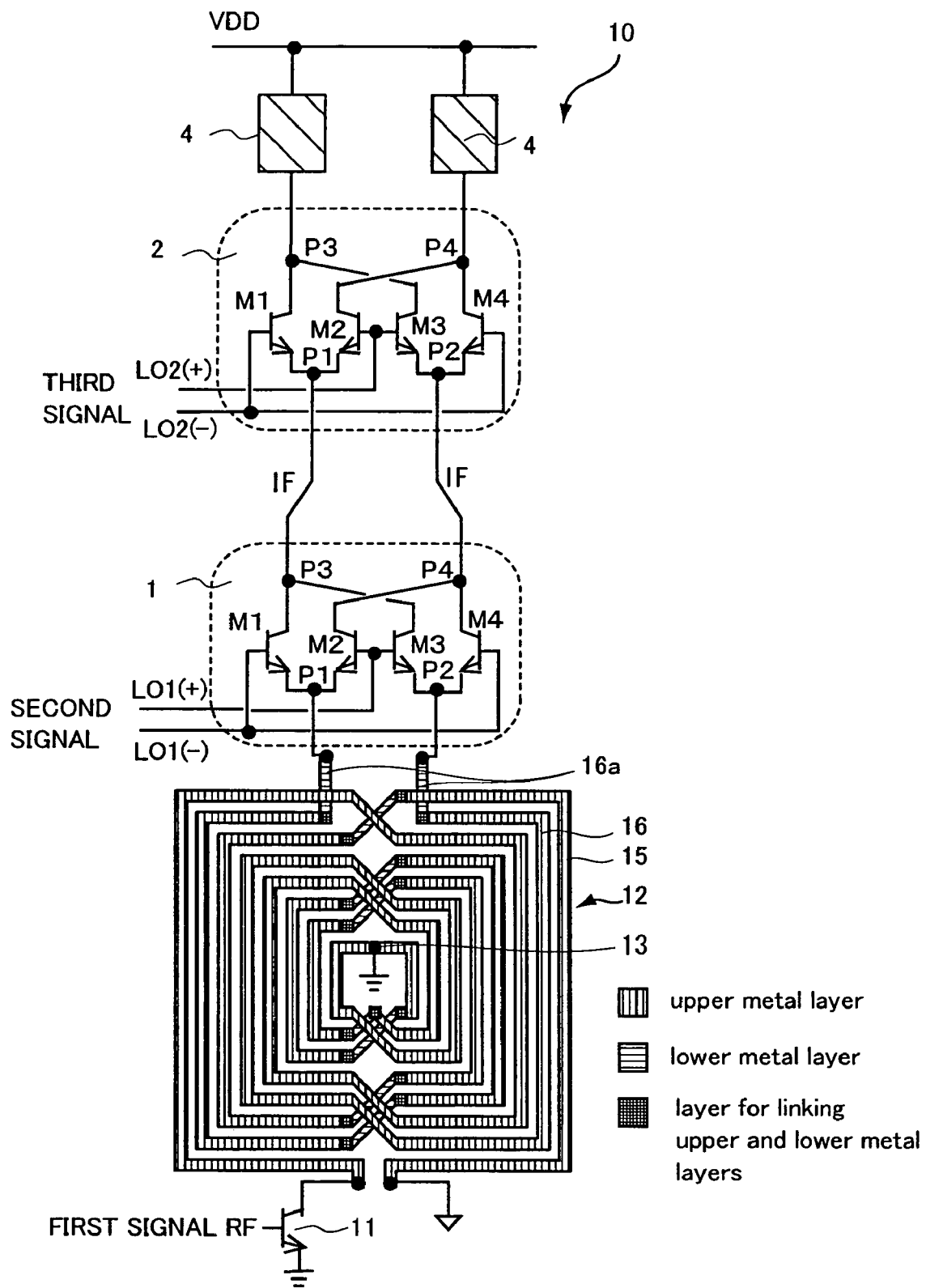
FIG. 2 is a circuit diagram showing the structure of a frequency converter according to Embodiment 1.

FIG. 2 is a circuit diagram showing the structure of a frequency converter according to Embodiment 1.

A frequency converter 10 includes a first switching circuit 1 for performing a first frequency conversion by mixing a first signal and a second signal, a second switching circuit 2 for performing a second frequency conversion by mixing a signal output from the first switching circuit 1 and a third signal, a balun 12, and an amplifier 11.

Figure 3:
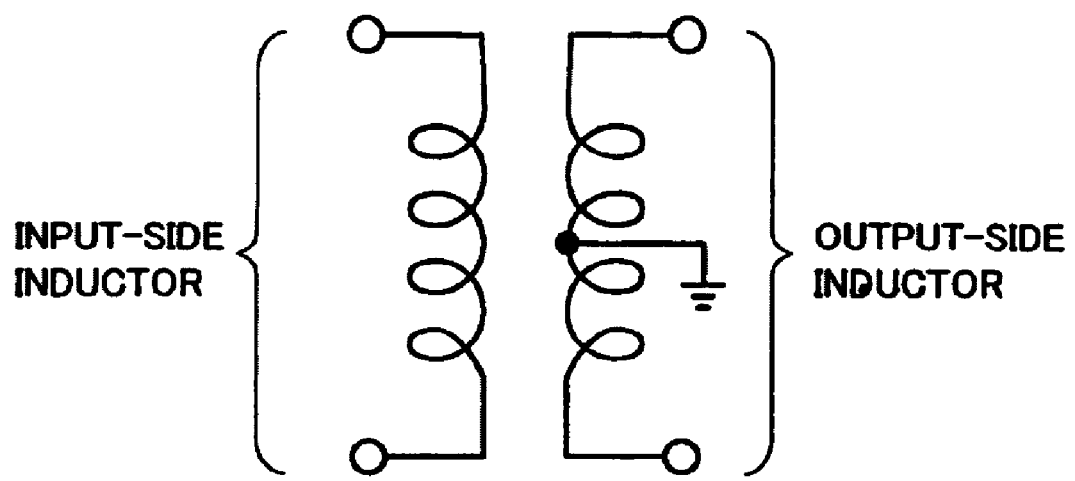
FIG. 3 is an equivalent circuit diagram of a balun.

Output terminals 16a of the balun 12 are coupled to the input terminals of the first switching circuit 1, and the first signal RF is transferred from the balun 12 to the first switching circuit 1 in the form of a current signal. FIG. 3 shows an equivalent circuit diagram of the balun 12. While the balun 12 may be formed of a discrete part provided in the periphery of a semiconductor substrate, in this Embodiment a balun formed on the same semiconductor substrate on which the switching circuits 1 and 2, which are frequency converters, are formed will be taken as an example.

The balun 12 has two inductors (input-side inductor 15 and output-side inductor 16) formed alternately on the semiconductor substrate and wound into a square shape. It should be noted that the balun 12 is not limited to the square shape; it may also be would into a polygonal shape such as a pentagon, a hexagon, a heptagon, and an octagon, or a circular shape, or the like. The balun 12 is formed of an upper metal layer, a lower metal layer, and a linkage layer for linking the upper and lower metal layers. These layers are formed on the semiconductor substrate. The upper metal layer and the lower metal layer are separated by an inter-layer insulation film (not shown) and electrically connected to each other via the linkage layer filled in through holes that are formed in the inter-layer insulation film. The first switching circuit 1, the second switching circuit 2, and the balun 12 are formed on the same semiconductor substrate.

As shown in the drawing, the balun 12 and the first switching circuit 1 are coupled by coupling the input terminals of the first switching circuit 1 and the output terminals 16a of the balun 12. At a center 13 of the output-side inductor 16 of the balun 12, a coupling point 13 is provided and the coupling point 13 is ground. One end of the input-side inductor 15 of the balun 12 is ground (actually, a power source voltage is coupled thereto) so that an AC signal can be provided to the first switching circuit 1, and the other end of the input-side inductor 15 is coupled to the output of the amplifying circuit 11 that is operated in a single-ended manner.

By operating the amplifying circuit 11 in a single-ended manner, noise occurrence is reduced by half the amount of noises for an amplifying circuit operated in a differential manner. This restricts the entire NF. Also, with the amplifying circuit 11 operated in a single-ended manner, this is more likely to realize a reduction in current consumption than in a differential manner. Further, with this structure, both of the differential output terminals 16a and 16a of the balun 12 supply the same amounts of current signals and DCs to the first switching circuit 1.

The amplifying circuit 11 can be of any structure insofar as it is operated in a single-ended manner. In this Embodiment, an example of the amplifying circuit 11 is an NPN transistor with the emitter ground and the RF signals input via the base. By providing the amplifying circuit 11, the potential difference between the emitter and base in the first and second switching circuits 1 and 2 is increased, resulting in an improvement of switching performance.

In this Embodiment, the first signal is a radio frequency signal (hereinafter referring to the first signal as a first signal RF), the second signal is a first local signal (hereinafter referring to the second signal as a second signal LO1) from a local oscillator or the like, and the third signal is a second local signal (hereinafter referring to the third signal as a third signal LO2) from a local oscillator or the like.

The first and second switching circuits 1 and 2 are switching circuits that perform input/output operations in a double-balanced manner. The first and second switching circuits 1 and 2 respectively include a transistor differential-pair made up of first and second bipolar transistors M1 and M2 (NPN) having respective emitters coupled to each other, and a transistor differential-pair made up of third and fourth bipolar transistors M3 and M4 (NPN) having respective emitters coupled to each other. The coupling point of the emitter of the first transistor M1 and the emitter of the second transistor M2 forms one input terminal P1 of the differential input terminals. The coupling point of the emitter of the third transistor M3 and the emitter of the fourth transistor M4 forms the other input terminal P2 of the differential input terminals. By operating the first and second switching circuits 1 and 2 in a differential manner, linearity and stability are improved.

The collector of the first bipolar transistor M1 and the collector of the third bipolar transistor M3 are coupled, and this coupling point forms one output terminal P3 of the differential output terminals. The collector of the second bipolar transistor M2 and the collector of the fourth bipolar transistor M4 are coupled, and this coupling point forms the other output terminal P4 of the differential output terminals.

In the first switching circuit 1, a positive-phase first local signal LO1 (+) (corresponding to the second signal) is applied from a local oscillator to each base of the second and third transistors M2 and M3. A negative-phase first local signal LO1 (−) (corresponding to the second signal) is applied from a local oscillator to each base of the first and fourth transistors M1 and M4. The frequency of the first local signal LO1 is set to be N/M (N and M are positive integers) the frequency of the first signal RF. The first switching circuit 1 outputs an intermediate frequency signal IF at the sum or difference of the frequency component of the second signal LO1, which is N/M (N and M are positive integers) the frequency of the first signal RF, and the frequency component of the first signal RF. The output terminal P3 of the first switching circuit 1 is coupled to an input terminal P1 of the second switching circuit 2, and the output terminal P4 of the first switching circuit 1 is coupled to an input terminal P2 of the second switching circuit 2.

In the second switching circuit 2, a positive-phase local signal LO2 (+) (corresponding to the third signal) is applied from a local oscillator to each base of the second and third transistors M2 and M3. A negative-phase local signal LO2 (−) (corresponding to the third signal) is applied from a local oscillator to each base of the first and fourth transistors M1 and M4.

The frequencies of the local signals LO2 are identical and set to be one of the frequencies that are |M±N|/M the frequency of the first signal RF.

Figure 4:
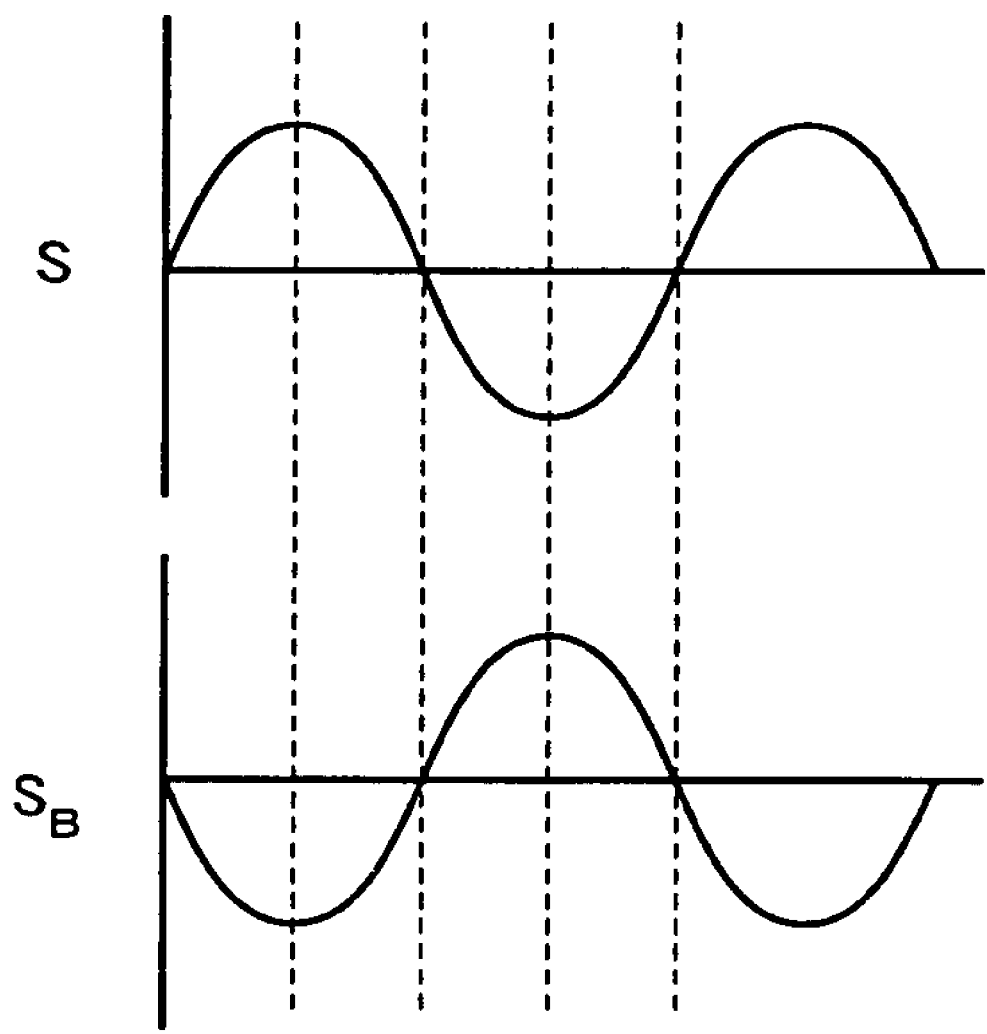
FIG. 4 is a waveform diagram of an output signal.

With this structure, the second switching circuit 2 performs conversion to a baseband frequency at the sum or difference of the frequency component of the local signal LO2 and the frequency component of the intermediate frequency signal IF, and outputs signals (S and $S_B$), as shown in FIG. 4.

Back in FIG. 2, an output load 4 is coupled to the output terminals P3 and P4 of the second switching circuit 2, and the output signal is output after converted into a voltage signal. The output load 4 is formed of a resistance, an inductor, and the like. A buffer amplifier that performs current-voltage conversion may be coupled to each of the output terminals of the second switching circuit 2 via a current source.

Additionally, since the frequency with which the first switching circuit 1 deals and the frequency with which the second switching circuit 2 deals are different, the sizes of the transistors forming the switching circuits are preferably selected to be optimum for respective NF and linearity. Specifically, different frequencies mean different suitable sizes for the transistors, and therefore it is preferable that the size of the transistor of the first switching circuit 1 differ from that of the second switching circuit 2.

Embodiment 2

Figure 5:
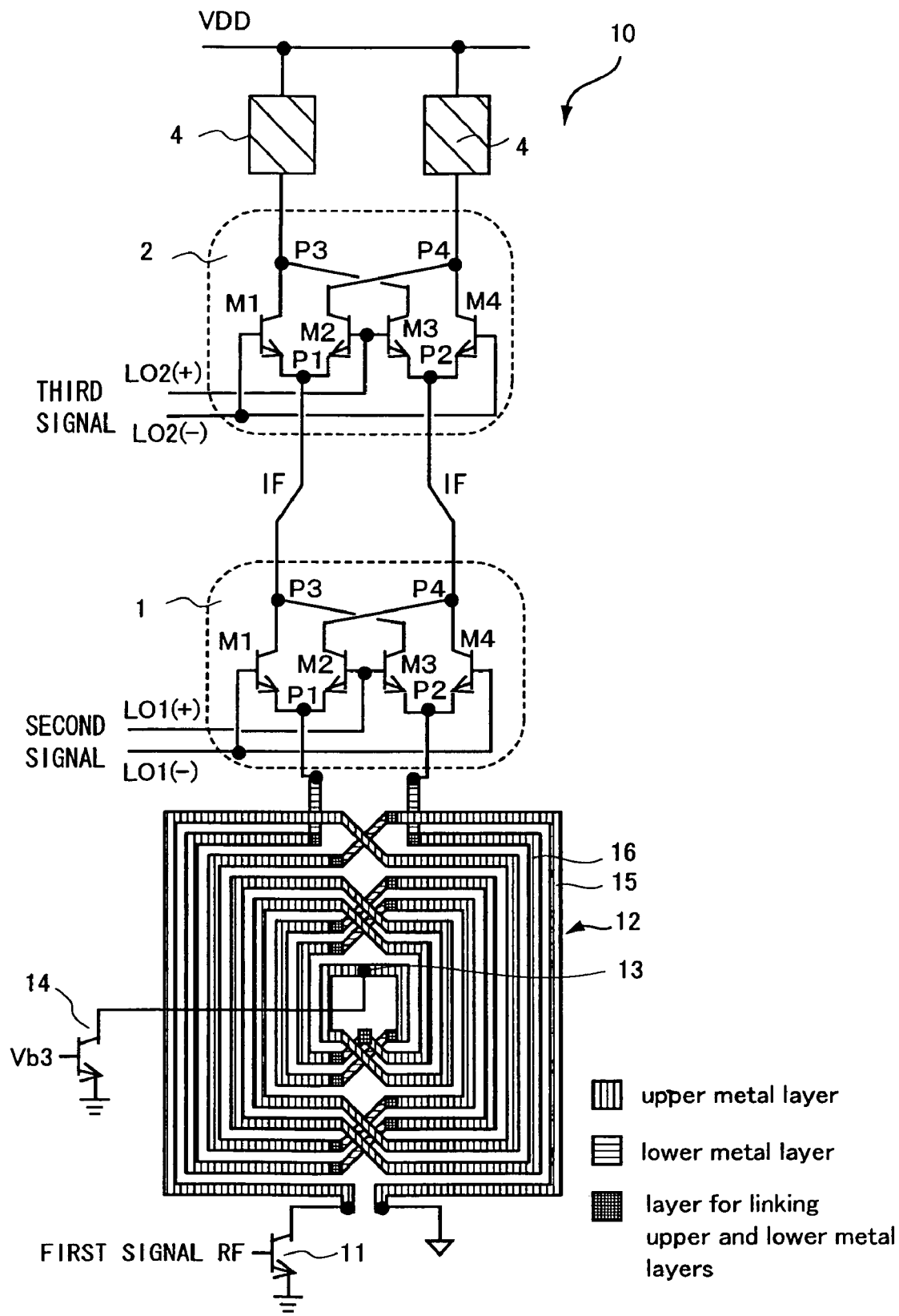
FIG. 5 is a circuit diagram of a frequency converter according to Embodiment 2.

FIG. 5 is a circuit diagram of a frequency converter according to Embodiment 2. Like reference numerals refer to like parts in FIGS. 2 and 5 and so will not be elaborated.

In a frequency converter according to Embodiment 2, a coupling point is provided at a center 13 of the output-side inductor 16 of the balun 12, and a current source 14 formed of a transistor (NPN) is coupled to the coupling point. To the base of the transistor forming the current source 14, a bias voltage Vb3 is applied. The bias voltage Vb3 is adjustable by a bias circuit (not shown). By coupling the current source 14 to the center 13 of the output-side inductor 16, stable currents are supplied to the switching circuits 1 and 2.

Embodiment 3

Figure 6:
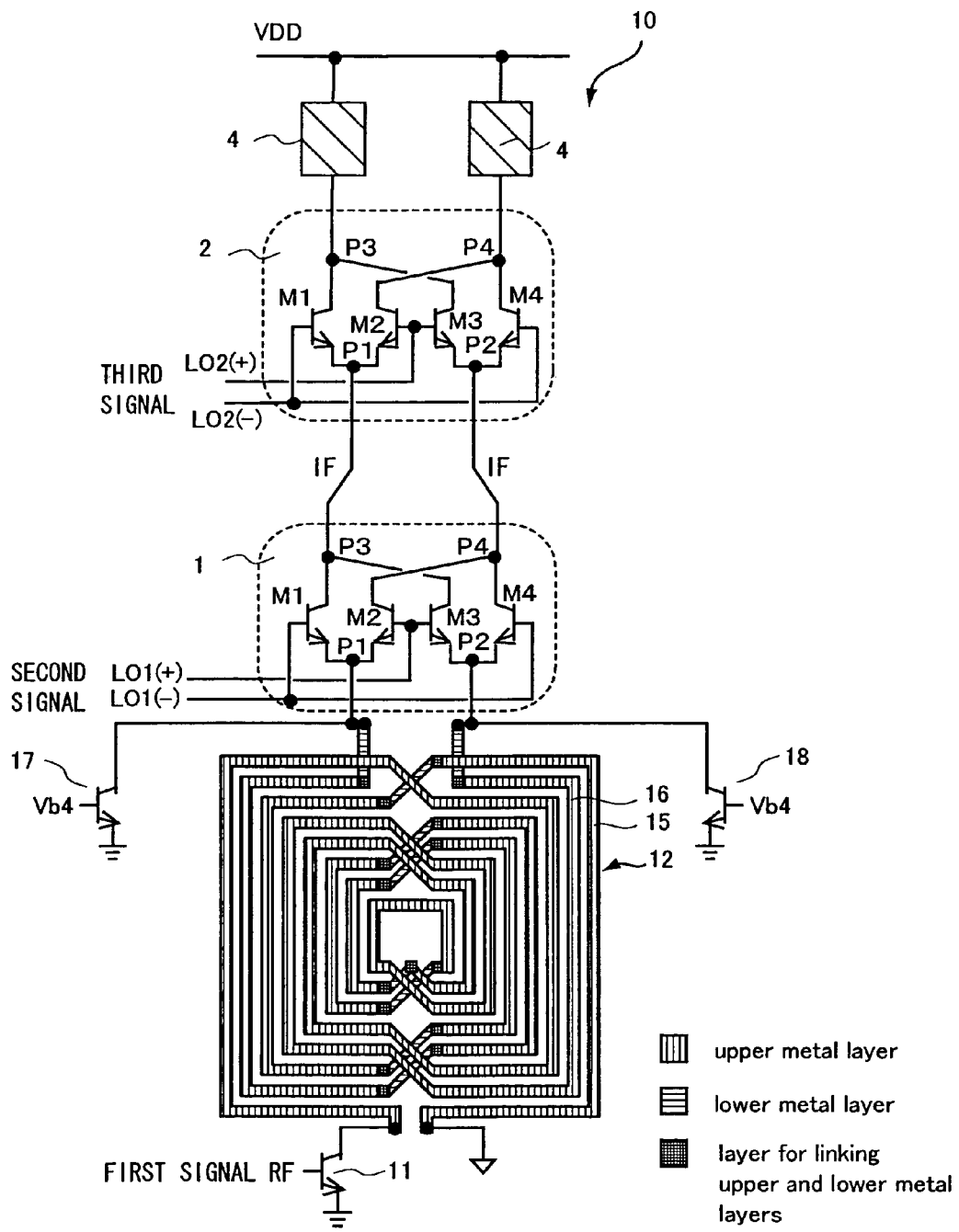
FIG. 6 is a circuit diagram of a frequency converter according to Embodiment 3.

FIG. 6 is a circuit diagram of a frequency converter according to Embodiment 3. Like reference numerals refer to like parts in FIGS. 2 and 6 and so will not be elaborated.

In a frequency converter according to Embodiment 3, current sources 17 and 18 each formed of a transistor (NPN) are independently coupled to the coupling points of the input terminals of the first switching circuit 1 and the output terminals of the balun 12. To each base of the transistors forming current sources 17 and 18, a bias voltage Vb4 is applied. The bias voltage Vb4 is adjustable by a bias circuit (not shown). By providing the current sources 17 and 18, stable currents are supplied to the switching circuits 1 and 2. In this case, there is no need to provide a coupling point at the center of the output-side inductor 16 of the balun 12, thus eliminating the need for a ground wire at the center of the inductor.

While in Embodiments 1, 2, and 3 the first frequency conversion and the second frequency conversion perform down-conversion, the first frequency conversion may be up-conversion with the second frequency conversion performing down-conversion to a baseband frequency. This also applies to the following Embodiments.

Since the frequency of the first signal RF and that of the second and third signals LO1 and LO2 are different, the second and third signals do not leak to the first signal terminal side. This reduces the occurrence of DC offsets, making it possible to restrict the degradation of reception sensitivity.

Embodiment 4

Figure 7:
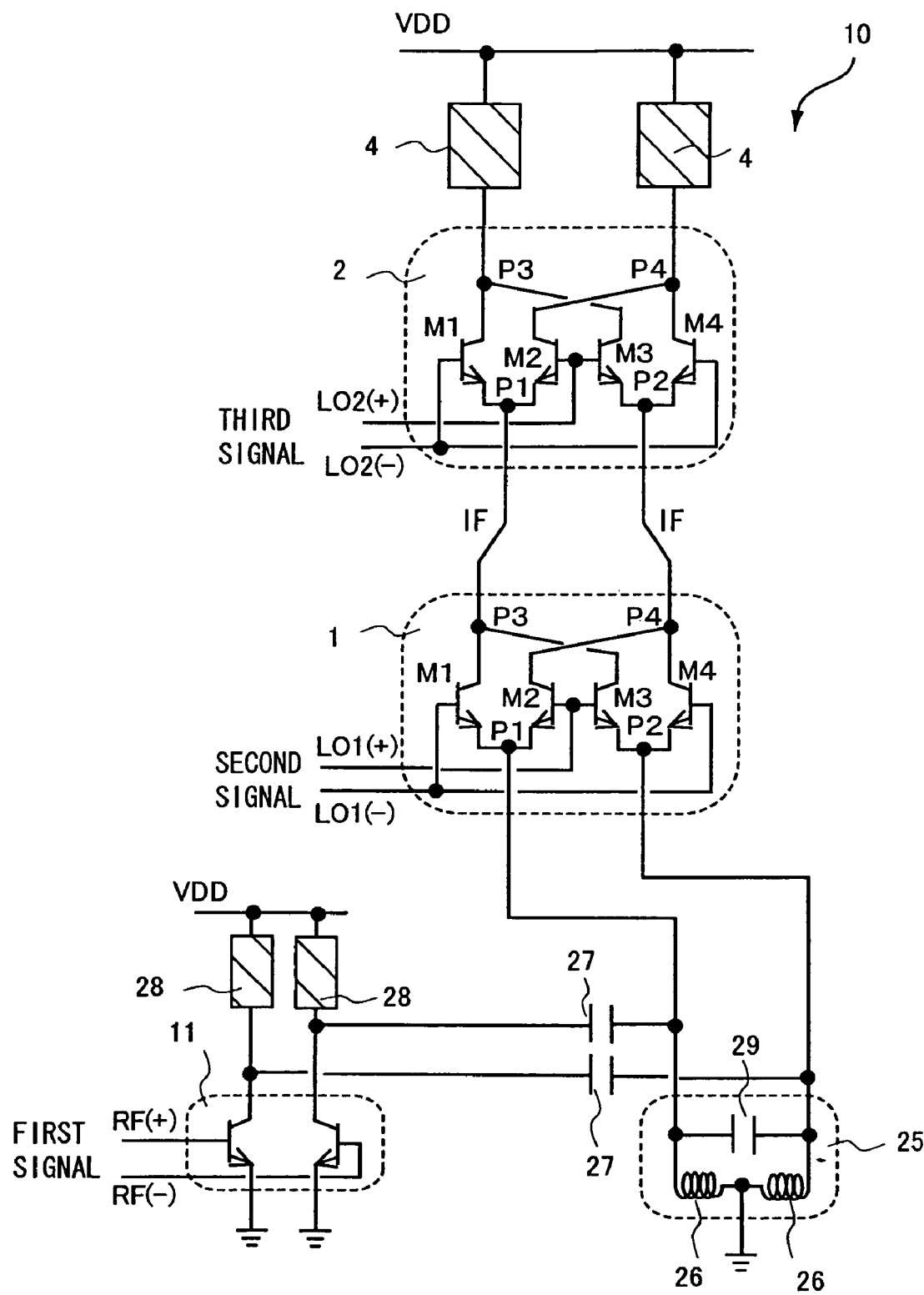
FIG. 7 is a circuit diagram of a frequency converter according to Embodiment 4.

FIG. 7 is a circuit diagram of a frequency converter according to Embodiment 4. Like reference numerals refer to like parts in FIGS. 2 and 7 and so will not be elaborated. In a frequency converter according to Embodiment 4, a differential amplifying circuit 11 formed of transistors (NPN) is coupled to the input terminals of the first switching circuit 1 via capacitors 27 for cutting direct currents. Each collector of the transistors forming the amplifying circuit 11 is coupled to a power supply voltage (VDD) via a load 28. A differential RF is input into the amplifying circuit 11.

A current source 25 is coupled to the coupling points of the input terminals of the first switching circuit 1 and the capacitors 27. In this Embodiment, the current source 25 is formed of a tank circuit including inductors 26 and a capacitor 29 so that the current source 25 resonates with the RF frequencies. The center of the inductors is ground. This structure increases the potential difference between the emitter and collector of each of the transistors forming the switching circuits 1 and 2, resulting in an improvement of switching performance. Also, the currents fed into the switching circuits 1 and 2 are set to current values optimum for reducing noise occurrence. It is preferable that these elements be formed on the same semiconductor substrate.

Figure 8:
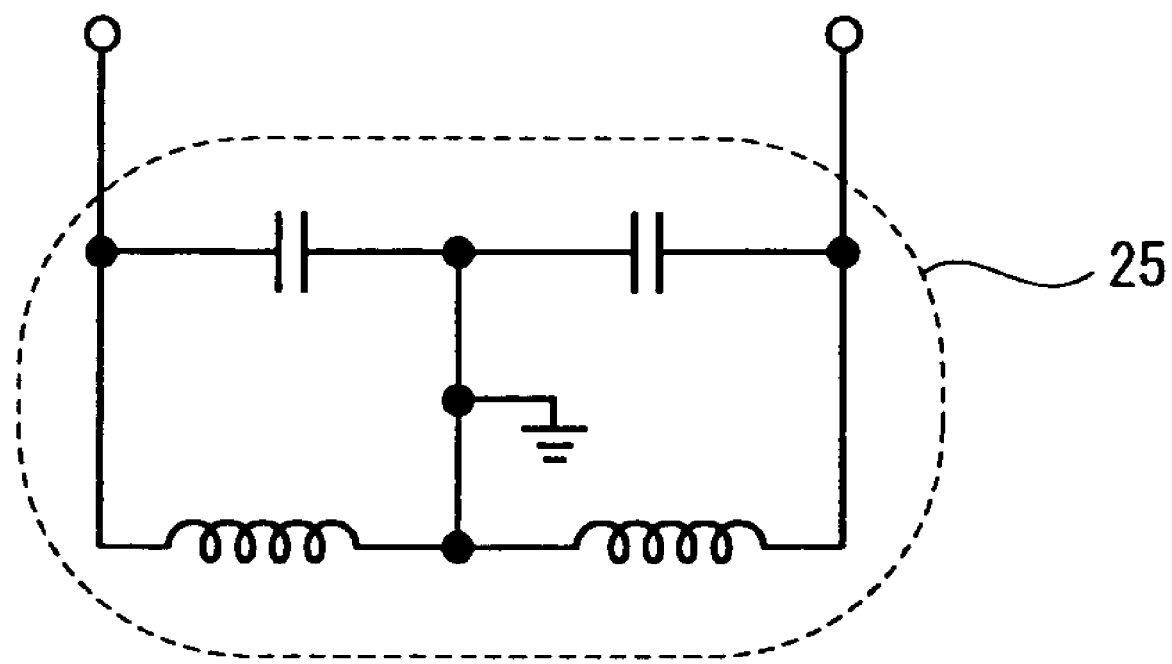
FIG. 8 is a circuit diagram showing another example of the structure of a current source.

The current source 25 may be formed of a tank circuit including two inductors and two capacitors as shown in FIG. 8. Alternatively, the current source 25 may be formed of transistors. In either case, the currents fed into the amplifying circuit 11 and the switching circuits 1 and 2 are set to appropriate current values, thereby optimizing switching performance and signal amplification performance.

Embodiment 5

Figure 9:
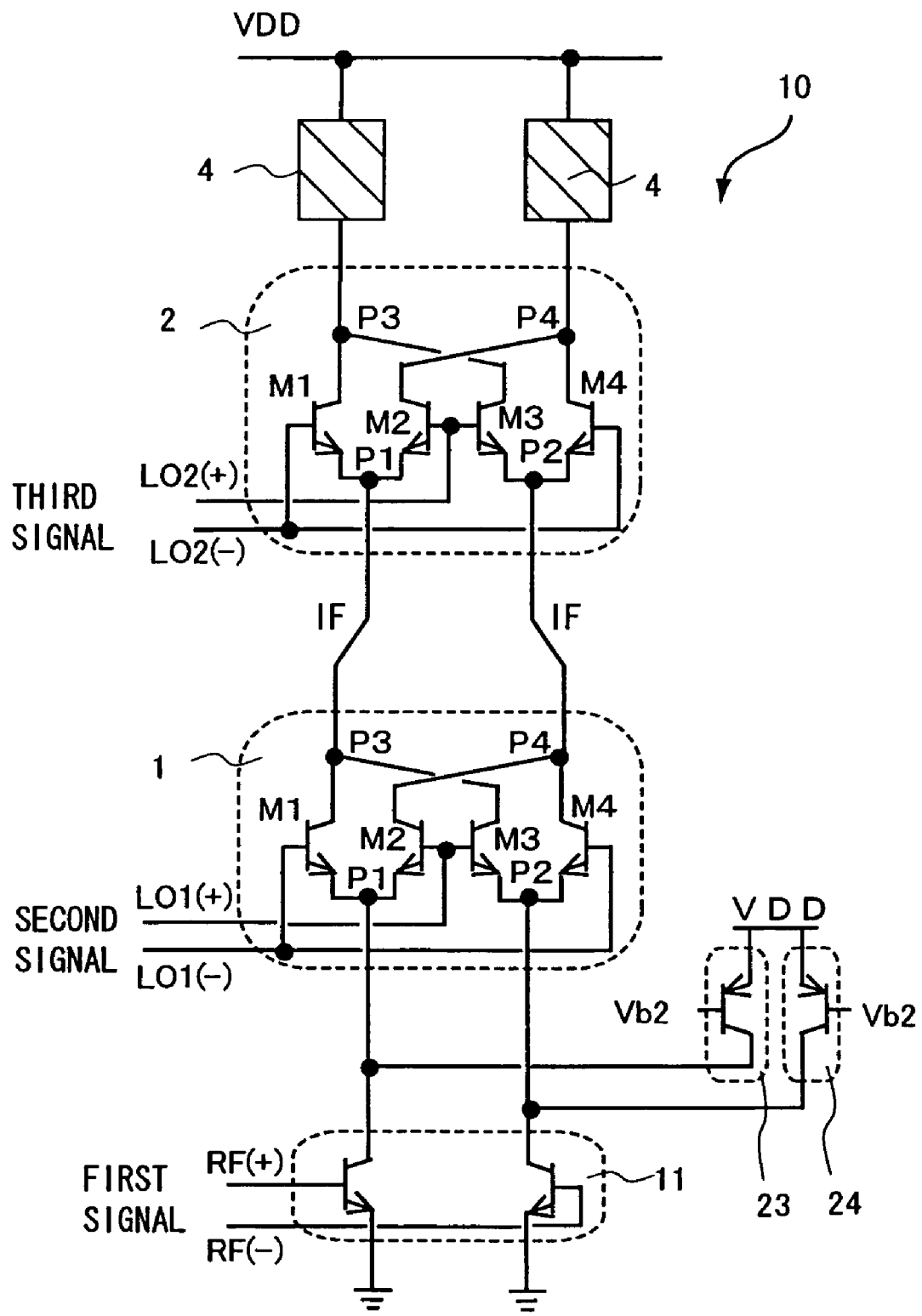
FIG. 9 is a circuit diagram showing the structure of a frequency converter according to Embodiment 5.

FIG. 9 is a circuit diagram showing the structure of a frequency converter according to Embodiment 5. Like reference numerals refer to like parts in FIGS. 2 and 9 and so will not be elaborated.

In a frequency converter according to Embodiment 5, a differential amplifying circuit 11 is coupled to the input terminals of the first switching circuit 1. The differential amplifying circuit 11 is formed of transistors (NPN) and a differential RF is input thereinto. Current sources 23 and 24 each formed of a transistor (PNP) are coupled to the coupling points of the input terminals of the first switching circuit 1 and the output terminals of the amplifying circuit 11. Appropriate currents are fed into the amplifying circuit 11 by adjusting a bias voltage Vb2. This optimizes switching performance and signal amplification performance. These elements are preferably formed on the same semiconductor substrate.

The frequency converters according to Embodiments 1 to 5 are particularly effective for applications such as analog TVs, where there is no need for separation into the I signal and Q signal. For radio communication devices using a demodulator that is configured to use the I signal and Q signal, frequency converters according to the following Embodiments are effective.

Figure 10:
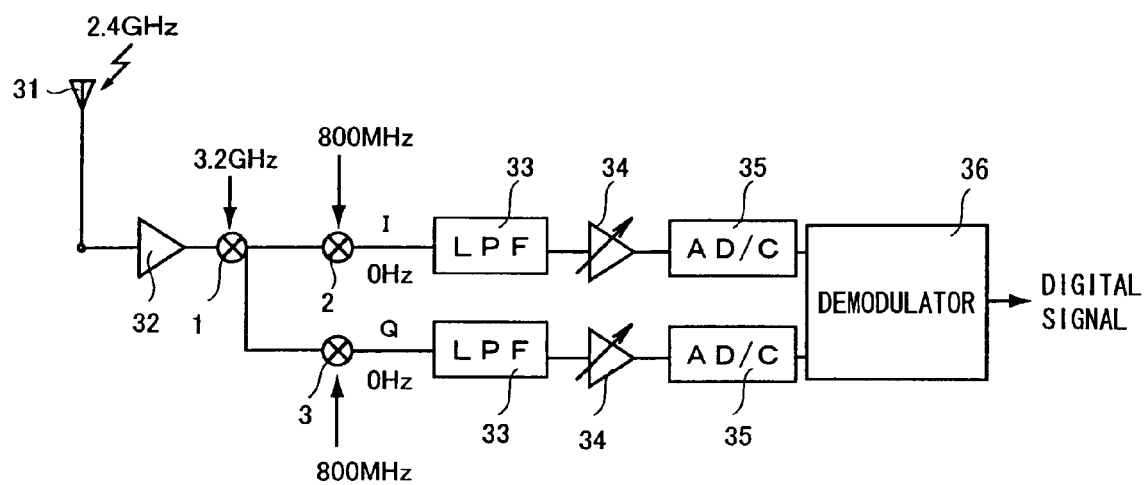
FIG. 10 is a block diagram of a terminal device of a wireless LAN transceiver that uses a frequency converter according to Embodiments 6 to 11.

FIG. 10 is a block diagram of a terminal device of a wireless LAN transceiver that uses a frequency converter according to Embodiments 6 to 11.

Referring to FIG. 10, a first signal (of, for example, 2.4 GHz) received via an antenna 31 is amplified in a low-noise amplifier (LNA) 32 and then transferred to a first switching circuit 1 in the form of, for example, a current signal.

The first switching circuit 1 performs a first frequency conversion by mixing the first signal and a second signal (of, for example, 3.2 GHz), thus converting the first signal down to 800 MHz, which is the difference of the first and second signals. The first switching circuit 1 supplies the resulting signal to a second switching circuit 2 and a third switching circuit 3 in a divided manner.

The second and third switching circuits 2 and 3 each perform a second frequency conversion by mixing the received signal and a signal of, for example, 800 MHz, thus generating a signal of an I or Q baseband frequency in a vicinity of 0 Hz, which is the difference of the received signal and the 800 MHz signal. The generated I and Q baseband frequency signals pass through low-pass filters 33 and are amplified in variable gain amplifiers (VGA) 34. The signals then pass through AD converters (AD/C) 35 and demodulators 36, and are extracted as digital signals.

Embodiments of this invention will be described in more detail referring to drawings.

Embodiment 6

Figure 11:
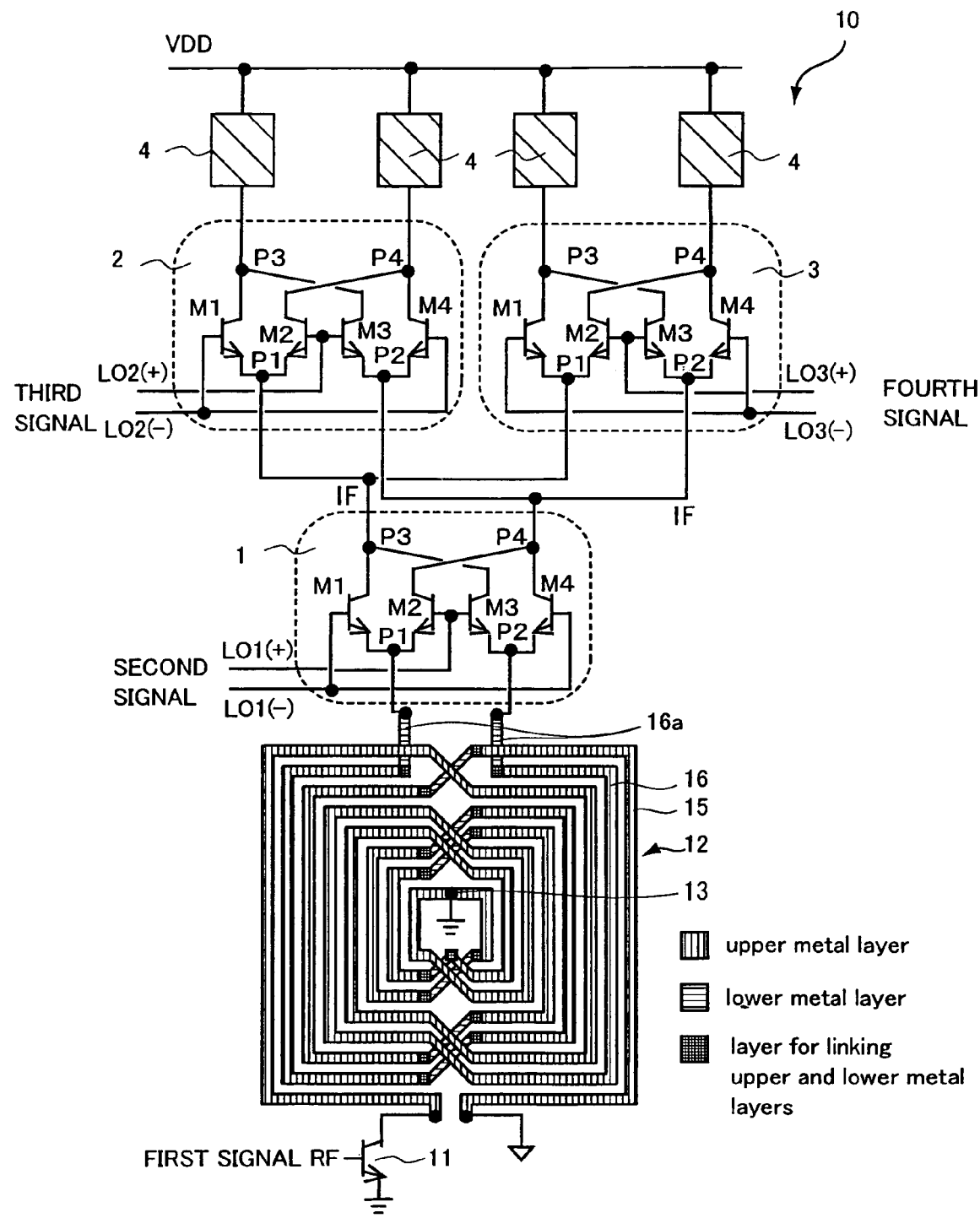
FIG. 11 is a circuit diagram showing the structure of a frequency converter according to Embodiment 6.

FIG. 11 is a circuit diagram showing the structure of a frequency converter according to Embodiment 6. Like reference numerals refer to like parts in FIGS. 2 and 11 and so will not be elaborated.

A frequency converter 10 includes a first switching circuit 1 for performing a first frequency conversion by mixing a first signal and a second signal, a second switching circuit 2 for performing a second frequency conversion by mixing a signal output from the first switching circuit 1 and a third signal, a third switching circuit for performing a second frequency conversion by mixing the signal output from the first switching circuit and a fourth signal, a balun 12, and an amplifier 11.

Output terminals 16a of the balun 12 are coupled to the input terminals of the first switching circuit 1, and the first signal RF is transferred from the balun 12 to the first switching circuit 1 in the form of a current signal. While the balun 12 may be formed of a discrete part provided in the periphery of a semiconductor substrate, in this Embodiment a balun formed on the same semiconductor substrate on which the switching circuits 1, 2, and 3, which are frequency converters, are formed will be taken as an example.

As shown in the drawing, the balun 12 and the first switching circuit 1 are coupled by coupling the input terminals of the first switching circuit 1 and the output terminals 16a of the balun 12. At a center 13 of the output-side inductor 16 of the balun 12, a coupling point 13 is provided and the coupling point 13 is ground. One end of the input-side inductor 15 of the balun 12 is ground (actually, a power source voltage is coupled thereto) so that an AC signal can be provided to the first switching circuit 1, and the other end of the input-side inductor 15 is coupled to the output of the amplifying circuit 11 that is operated in a single-ended manner.

By operating the amplifying circuit 11 in a single-ended manner, noise occurrence is reduced by half the amount of noises for an amplifying circuit operated in a differential manner. This restricts the entire NF. Also, with the amplifying circuit 11 operated in a single-ended manner, this is more likely to realize a reduction in current consumption than in a differential manner. Further, with this structure, both of the differential output terminals 16a and 16a of the balun 12 supply the same amounts of current signals and DCs to the first switching circuit 1.

The amplifying circuit 11 can be of any structure insofar as it is operated in a single-ended manner. In this Embodiment, an example of the amplifying circuit 11 is an NPN transistor with the emitter ground and the RF signals input via the base.

In this Embodiment, the first signal is a radio frequency signal (hereinafter referring to the first signal as a first signal RF), the second signal is a first local signal (hereinafter referring to the second signal as a second signal LO1) from a local oscillator or the like, the third signal is a second local signal (hereinafter referring to the third signal as a third signal LO2) from a local oscillator or the like, and the fourth signal is a third local signal (hereinafter referring to the fourth signal as a fourth signal LO3) from a local oscillator or the like.

As described later, the second switching circuit 2 outputs an I signal and the third switching circuit 3 outputs a Q signal.

The first to third switching circuits 1 to 3 are switching circuits that perform input/output operations in a double-balanced manner. The first to third switching circuits 1 to 3 respectively include a transistor differential-pair made up of first and second bipolar transistors M1 and M2 (NPN) having respective emitters coupled to each other, and a transistor differential-pair made up of third and fourth bipolar transistors M3 and M4 (NPN) having respective emitters coupled to each other. The coupling point of the emitter of the first transistor M1 and the emitter of the second transistor M2 forms one input terminal P1 of the differential input terminals. The coupling point of the emitter of the third transistor M3 and the emitter of the fourth transistor M4 forms the other input terminal P2 of the differential input terminals. By operating the switching circuits 1 to 3 in a differential manner, linearity and stability is improved.

The collector of the first bipolar transistor M1 and the collector of the third bipolar transistor M3 are coupled, and this coupling point forms one output terminal P3 of the differential output terminals. The collector of the second bipolar transistor M2 and the collector of the fourth bipolar transistor M4 are coupled, and this coupling point forms the other output terminal P4 of the differential output terminals.

In the first switching circuit 1, a positive-phase first local signal LO1 (+) (corresponding to the second signal) is applied from a local oscillator to each base of the second and third transistors M2 and M3. A negative-phase first local signal LO1 (−) (corresponding to the second signal) is applied from a local oscillator to each base of the first and fourth transistors M1 and M4. The frequency of the first local signal LO1 is set to be N/M (N and M are positive integers) the frequency of the first signal RF. The first switching circuit 1 outputs an intermediate frequency signal IF at the sum or difference of the frequency component of the second signal LO1, which is N/M (N and M are positive integers) the frequency of the first signal RF, and the frequency component of the first signal RF. The output terminal P3 of the first switching circuit 1 is coupled to each input terminal P1 of the second and third switching circuits 2 and 3, and the output terminal P4 of the first switching circuit 1 is coupled to each input terminal P2 of the second and third switching circuits 2 and 3.

In the second switching circuit 2, a positive-phase local signal LO2 (+) (corresponding to the third signal) is applied from a local oscillator to each base of the second and third transistors M2 and M3. A negative-phase local signal LO2 (−) (corresponding to the third signal) is applied from a local oscillator to each base of the first and fourth transistors M1 and M4. In the third switching circuit 3, a positive-phase local signal L03 (+) (corresponding to the fourth signal) is applied from a local oscillator to each base of the second and third transistors M2 and M3. A negative-phase local signal LO3 (−) (corresponding to the fourth signal) is applied from a local oscillator to each base of the first and fourth transistors M1 and M4.

The frequencies of the local signals LO2 and LO3 are identical and set to be one of the frequencies that are |M±N|/M the frequency of the first signal RF. Further, the phases of the local signal LO2 and the local signal LO3 are different by 90 degrees. For example, if the phase of the local signal LO2 (+) is 0 degrees and that of the local signal LO2 (−) 180 degrees, then the phase of the local signal LO3 (+) is 90 degrees and that of the local signal LO3 (−) 270 degrees.

Figure 12:
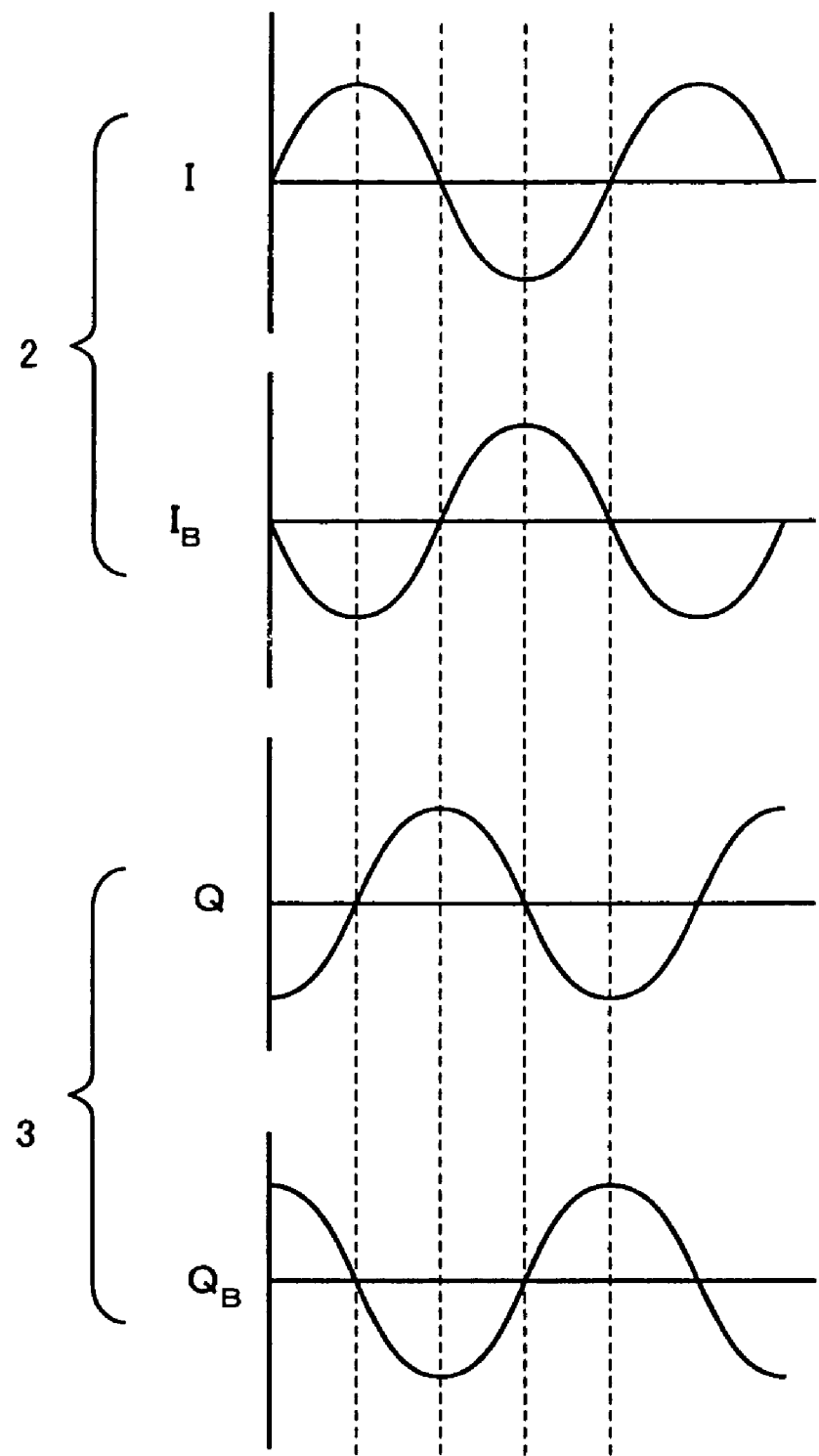
FIG. 12 shows waveform diagrams of I and Q output signals.

With this structure, as shown in FIG. 12, the second switching circuit 2 performs conversion to a baseband frequency at the sum or difference of the frequency component of the local signal LO2 and the frequency component of the intermediate frequency signal IF, and outputs I signals (I and $I_B$). As for the third switching circuit 3, the local signal LO3 that has the same frequency as that of the signal supplied to the switching circuit 2 and that has a phase different from that of said signal by 90 degrees is supplied to the switching circuit 3. The switching circuit 3 accordingly outputs signals Q (Q and $Q_B$) of a baseband frequency which have phases off the phases of the I output signals (I and $I_B$) by 90 degrees.

Back in FIG. 11, an output load 4 is coupled to the output terminals of the second switching circuit 2 and the third switching circuit 3, and the output signal is output after converted into a voltage signal. The output load 4 is formed of a resistance, an inductor, and the like. A buffer amplifier that performs current-voltage conversion may be coupled to each of the output terminals of the second switching circuit 2 and the third switching circuit 3 via a current source.

Additionally, since the frequency with which the first switching circuit 1 deals and the frequency with which the second and third switching circuits 2 and 3 deal are different, the sizes of the transistors forming the switching circuits are preferably selected to be optimum for respective NF and linearity. Specifically, different frequencies have different suitable sizes for the transistors, and therefore it is preferable that the size of the transistor of the first switching circuit 1 differ from those of the second and third switching circuits 2 and 3.

Embodiment 7

Figure 13:
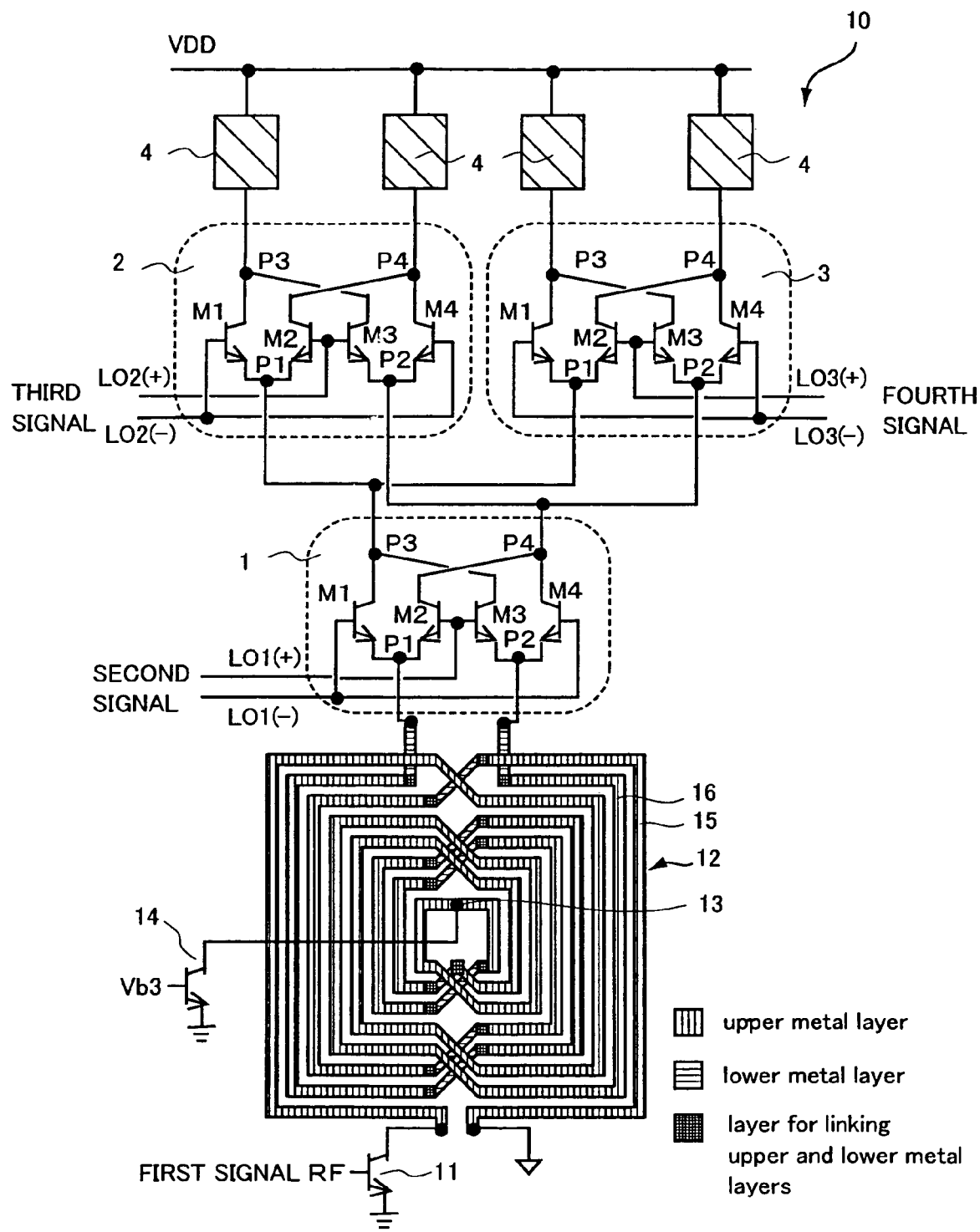
FIG. 13 is a circuit diagram showing the structure of a frequency converter according to Embodiment 7.

FIG. 13 is a circuit diagram showing the structure of a frequency converter according to Embodiment 7. Like reference numerals refer to like parts in FIGS. 11 and 13 and so will not be elaborated.

In a frequency converter according to Embodiment 7, a coupling point is provided at a center 13 of the output-side inductor 16 of the balun 12, and a current source 14 formed of a transistor (NPN) is coupled to the coupling point. To the base of the transistor forming the current source 14, a bias voltage Vb3 is applied. The bias voltage Vb3 is adjustable by a bias circuit (not shown). By coupling the current source 14 to the center 13 of the output-side inductor 16, stable currents are supplied to the switching circuits 1 to 3.

Embodiment 8

Figure 14:
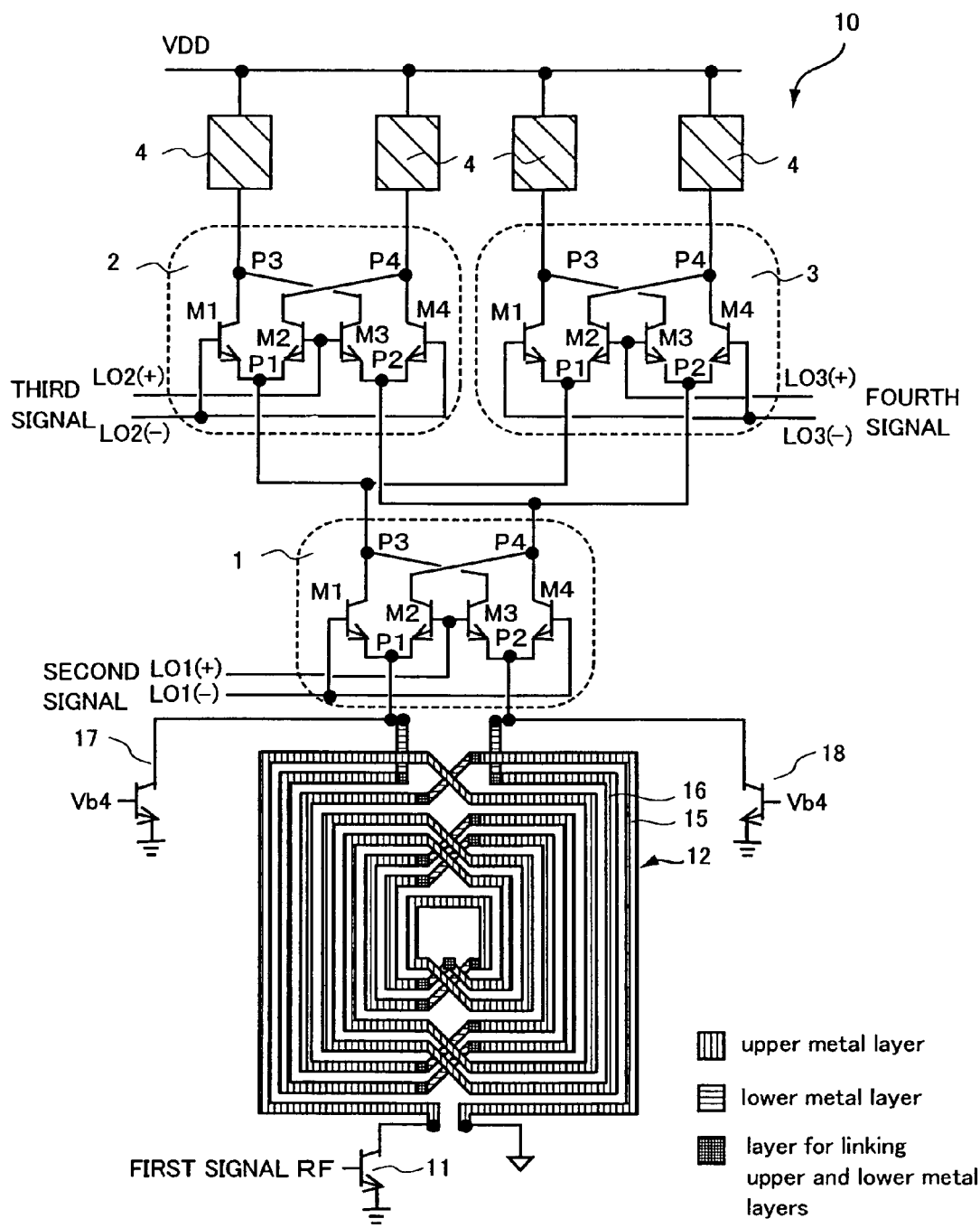
FIG. 14 is a circuit diagram of a frequency converter according to Embodiment 8.

FIG. 14 is a circuit diagram of a frequency converter according to Embodiment 8. Like reference numerals refer to like parts in FIGS. 11 and 14 and so will not be elaborated.

In a frequency converter according to Embodiment 8, current sources 17 and 18 each formed of a transistor (NPN) are independently coupled to the input terminals of the first switching circuit 1 and to the output terminals of the balun 12. To each base of the transistors forming current sources 17 and 18, a bias voltage Vb4 is applied. The bias voltage Vb4 is adjustable by a bias circuit (not shown). By providing the current sources 17 and 18, stable currents are supplied to the switching circuits 1 to 3. In this case, there is no need to provide a coupling point at the center of the output-side inductor 16 of the balun 12, thus eliminating the need for a ground wire at the center of the inductor.

The above-described structure where the second switching circuit 2 for the I signal and the third switching circuit 3 for the Q signal are independently provided reduces the leakage of the local signal to the input side, even if the layout of circuit components is not bilaterally symmetric or there are process variations. (Similar discussions are given in, for example, H. Sjoland et al: "A Marged CMOS LNA and Mixer for a WCDMA Receiver" IEEE J. Solid-State Circuits, Vol. 38, No. 6 (2003), pp. 1045-1050.)

Since the frequency of the first signal RF and that of the second to fourth signals LO1 to LO3 are different, the second to fourth signals do not leak to the first signal terminal side. This reduces the occurrence of DC offsets, making it possible to restrict the degradation of reception sensitivity.

Embodiment 9

Figure 15:
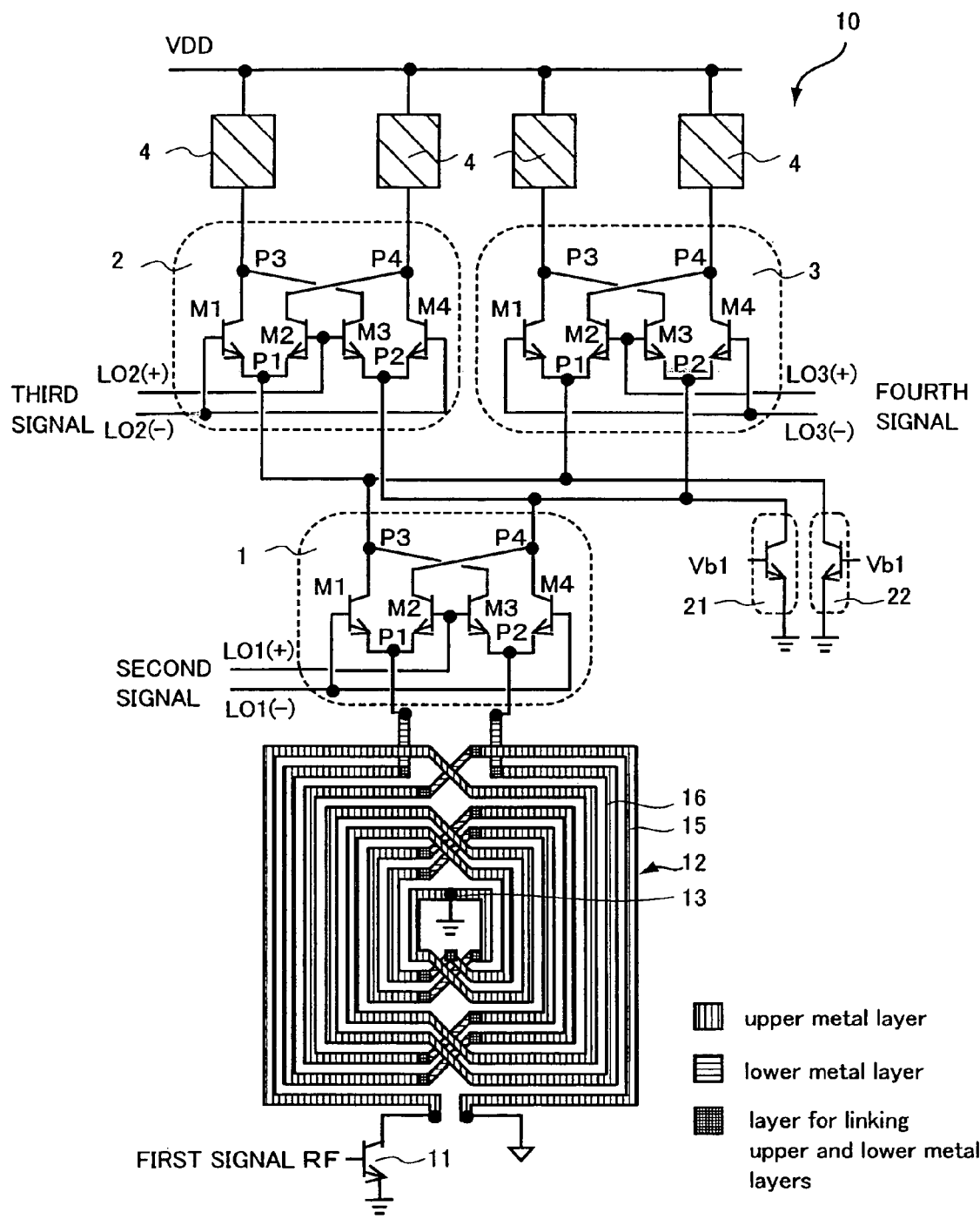
FIG. 15 is a circuit diagram of a frequency converter according to Embodiment 9.

FIG. 15 is a circuit diagram of a frequency converter according to Embodiment 9. Like reference numerals refer to like parts in FIGS. 11 and 15 and so will not be elaborated.

Referring to FIG. 15, current sources 21 and 22 are coupled to the coupling points of the first switching circuit 1 and the second and third switching circuits 2 and 3. The current sources 21 and 22 are each formed of a transistor (NPN). To each base of the transistors forming the current sources 21 and 22, a bias voltage Vb1 is applied. The bias voltage Vb1 is adjustable by a bias circuit (not shown).

As seen from FIG. 15, the amount of current flowing through the first switching circuit 1 is the sum of the amount of current flowing through the second switching circuit 2 and that of current flowing through the third switching circuit 3. Even if some amount of current is optimum for the second switching circuit 2 and another some amount of current optimum for the third switching circuit 3, the sum of them is not necessarily so for the first switching circuit 1. Likewise, even if some amount of current is optimum for flowing through the first switching circuit 1, this is not necessarily so for the amplifying circuit 11. In view of this, the bias voltage Vb1 is adjusted so that appropriate currents are fed into the first to third switching circuits 1 to 3 and into the amplifying circuit 11. This optimizes switching performance and signal amplification performance.

Figure 20:
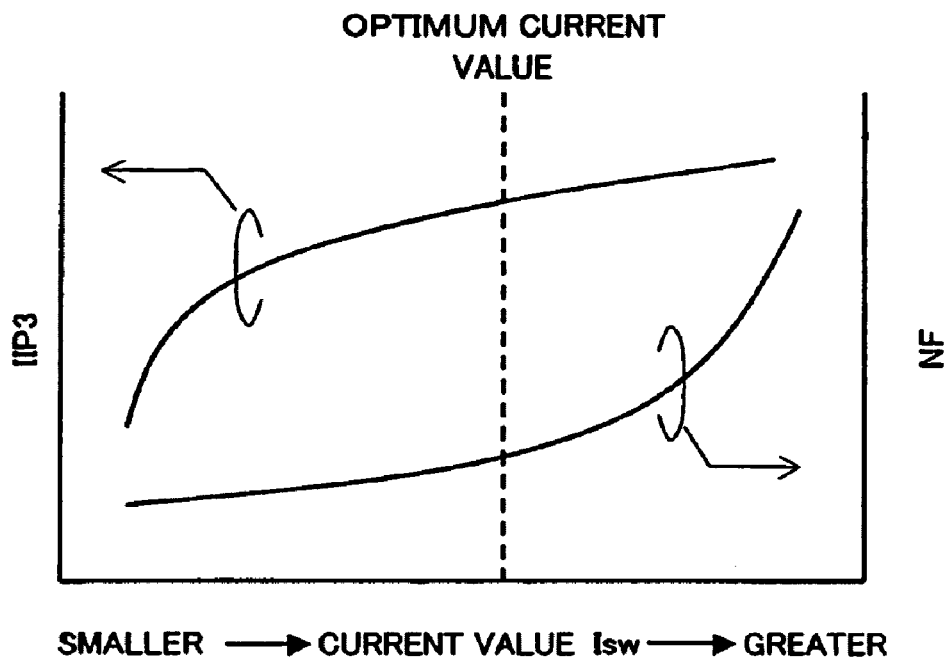
FIG. 20(A) is a graph showing the current (Isw) flowing through the switching circuits vs. NF and third order input intercept point (IIP3)
FIG. 20(B) is a graph showing the current (Igm) flowing through an amplifying circuit vs. NF and third order input intercept point (IIP3).
Figure 20:
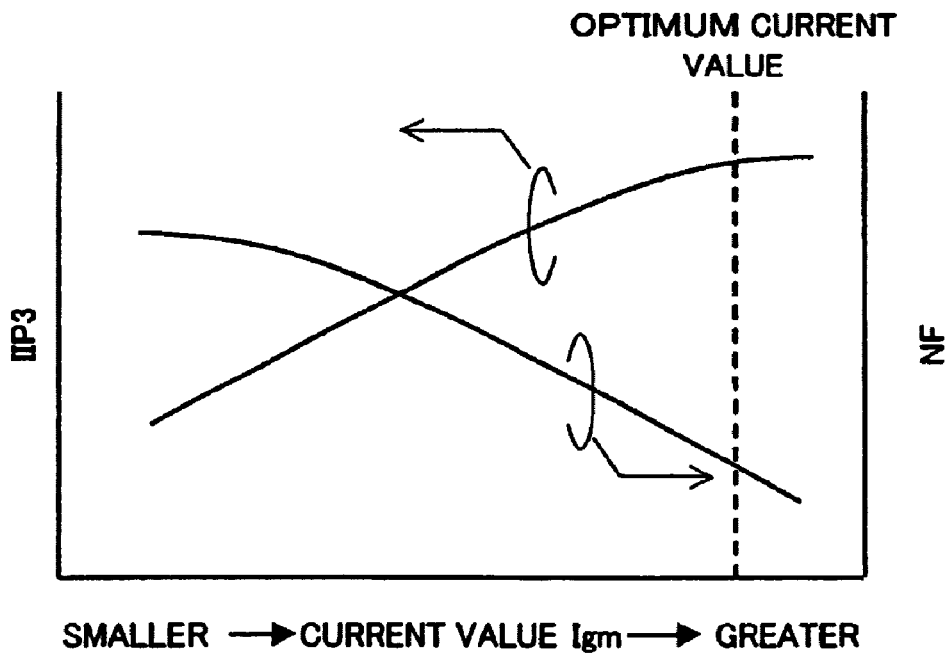

The current Isw flowing through the switching circuit and IIP3 (third order distortion), and the current Isw flowing through the switching circuit and NF (Noise Figure) have the relations shown in FIG. 20(A). It is known to be preferred that IIP3 is greater and Isw is smaller. In view of this, the amount of current is adjusted to balance the IIP3 and Isw, thus making possible to obtain an optimum amount of current. This relation applies to the amplifying circuit 11 shown in FIG. 20(B). By adjusting the amount of current to balance the IIP3 and Isw, an optimum amount of current can be obtained.

Embodiment 10

Figure 16:
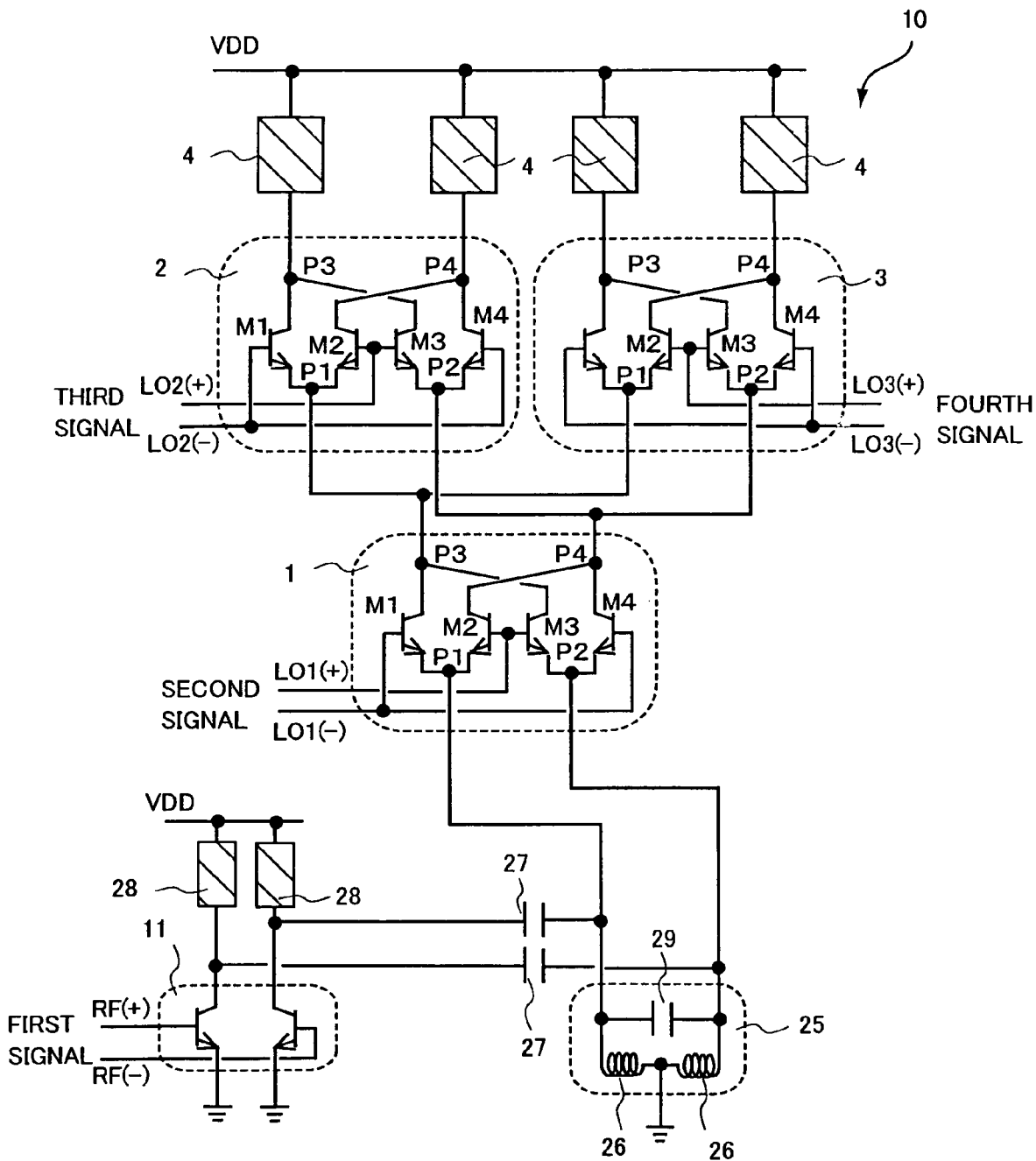
FIG. 16 is a circuit diagram of a frequency converter according to Embodiment 10.

FIG. 16 is a circuit diagram of a frequency converter according to Embodiment 10. Like reference numerals refer to like parts in FIGS. 11 and 16 and so will not be elaborated. In a frequency converter according to Embodiment 10, a differential amplifying circuit 11 formed of transistors (NPN) is coupled to the input terminals of the first switching circuit 1 via capacitors 27. A differential RF is input into the amplifying circuit 11. A current source 25 is coupled to the coupling points of the input terminals of the first switching circuit 1 and the capacitors 27. In this Embodiment, the current source 25 is formed of a tank circuit including inductors 26 and a capacitor 29 so that the current source 25 resonates with the RF frequencies. The center of the inductors is ground. This structure increases the potential difference between the emitter and collector of each of the transistors forming the switching circuits 1, 2, and 3, resulting in an improvement of switching performance. Also, the current fed into the switching circuit 1 is set to current values optimum for reducing noise occurrence.

The current source 25 may be formed of a tank circuit including two inductors and two capacitors as shown in FIG. 8. Alternatively, the current source 25 may be formed of transistors. In either case, the currents fed into the amplifying circuit 11 and the first to third switching circuits 1 to 3 are set to appropriate current values, thereby optimizing switching performance and signal amplification performance.

Embodiment 11

Figure 17:
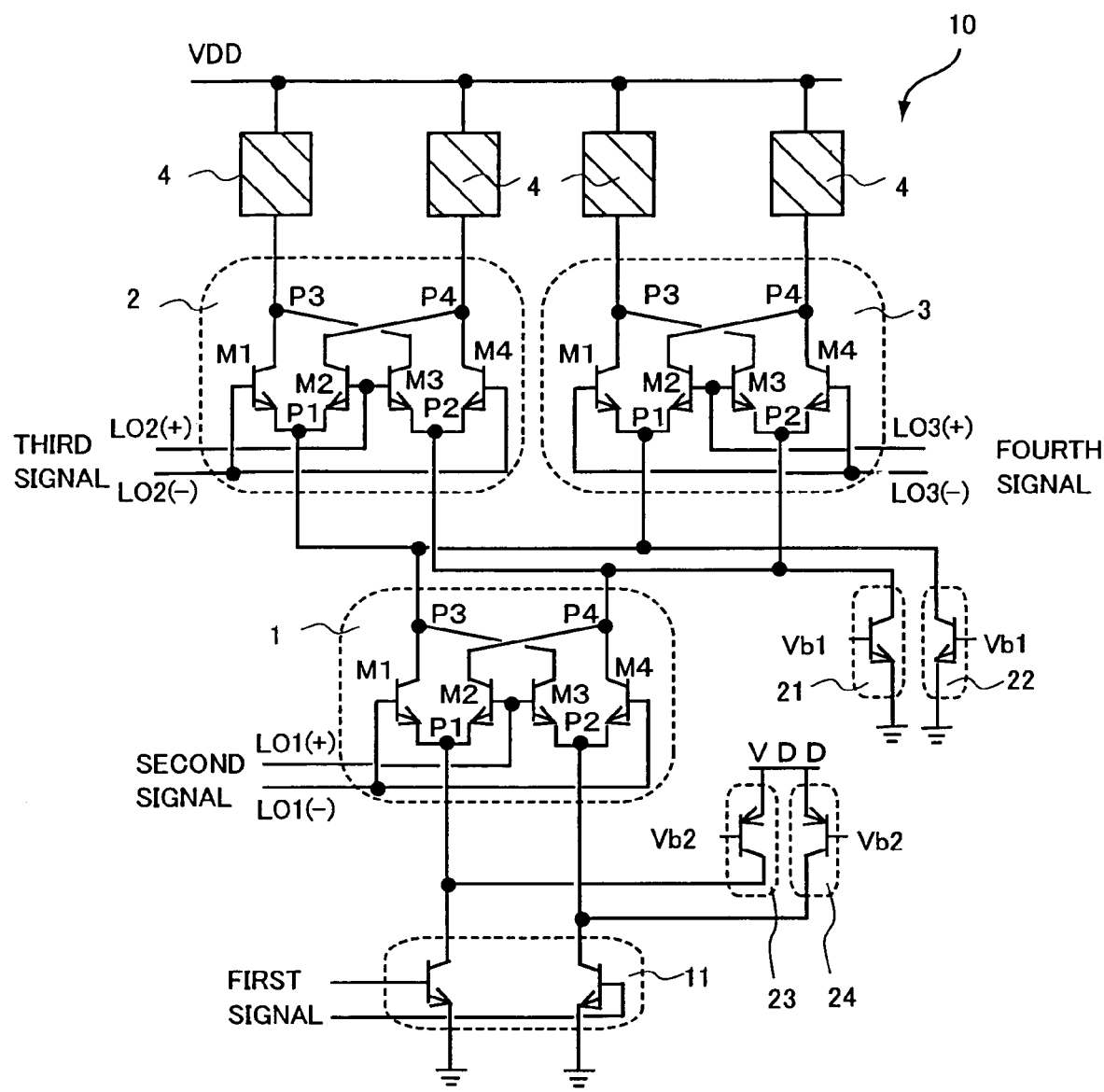
FIG. 17 is a circuit diagram showing the structure of a frequency converter according to Embodiment 11.
Figure 18:
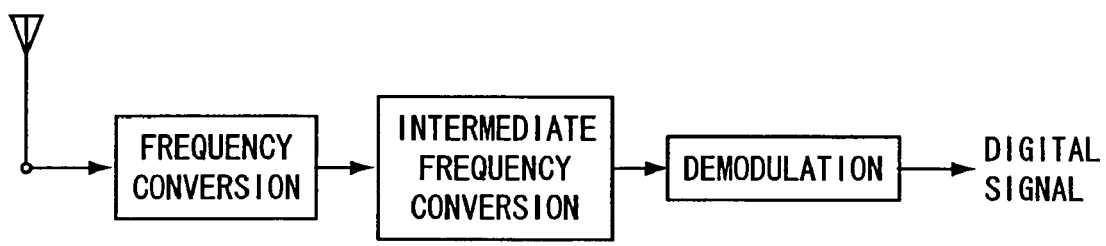
FIG. 18 is a block diagram of a known terminal unit such as a wireless LAN transceiver.
Figure 19:
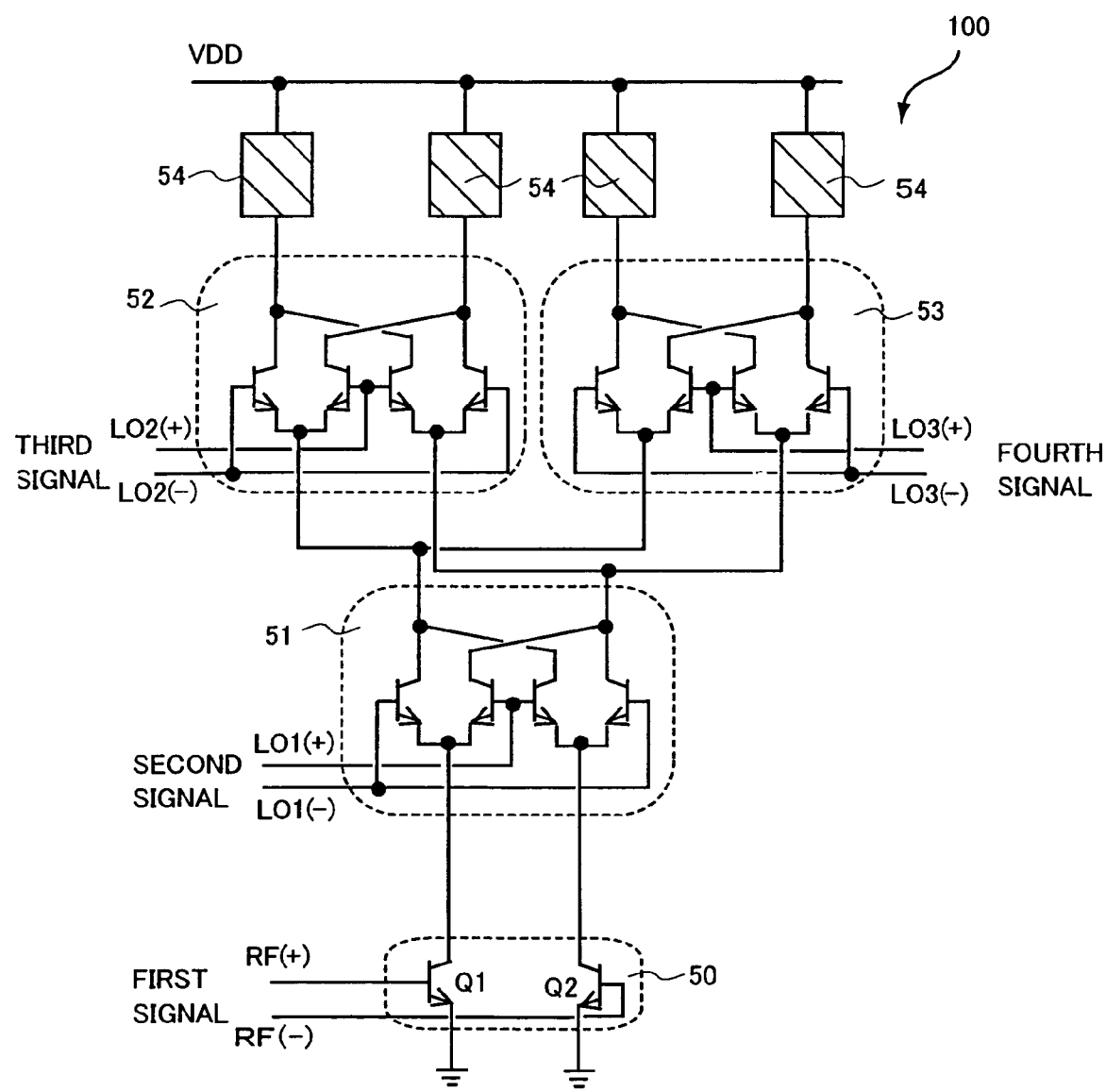
FIG. 19 is a circuit diagram of a known frequency converter.

FIG. 17 is a circuit diagram showing the structure of a frequency converter according to Embodiment 11. Like reference numerals refer to like parts in FIGS. 11 and 17 and so will not be elaborated.

In a frequency converter according to Embodiment 11, a differential amplifying circuit 11 is coupled to the input terminals of the first switching circuit 1. The differential amplifying circuit 11 is formed of transistors (NPN) and a differential RF is input thereinto. Current sources 21 and 22 each formed of a transistor (NPN) are coupled to the coupling points of the output terminals of the first switching circuit 1 and the input terminals of the second switching circuit 2, and to the coupling points of the output terminals of the first switching circuit 1 and the input terminals of the third switching circuit 3. To each base of the transistors forming the current sources 21 and 22, a bias voltage Vb1 is applied. The bias voltage Vb1 is adjustable by a bias circuit (not shown). Appropriate currents are fed into the first to third switching circuits 1 to 3 by adjusting the bias voltage Vb1.

Further, current sources 23 and 24 each formed of a transistor (NPN) are coupled to the coupling points of the input terminals of the first switching circuit 1 and output terminals of the amplifying circuit 11. Appropriate currents are fed into the amplifying circuit 11 by adjusting a bias voltage Vb2. This optimizes switching performance and signal amplification performance.

While in the above Embodiments mainly bipolar transistors have been exemplified to form the IC chip elements, this invention is not limited to the bipolar transistors; other types of transistors can be used such as MOS transistors.

While in the above Embodiments a case in which the first signal is transferred to the first switching circuit in the form of a current signal with the use of the balun has been exemplified, this invention is not limited to such a case; the first signal may be transferred to the first switching circuit in the form of a voltage signal with the use of the balun.

While in the above Embodiments a frequency converter that performs dual frequency conversion has been exemplified, this invention is not limited to dual conversion; the present invention can also be applicable to a case in which frequency conversion is performed a plurality of times including twice.

While in the above Embodiments a wireless LAN transceiver to which the frequency converter of the present invention is applied has been exemplified, this invention is not limited to the transceiver; the present invention can be applicable to all kinds of radio communication devices that utilize radio waves such as mobile telephones and TVs.

Also, the present invention is applicable to phase compensators and the like that generate a local signal by multiplying an output signal by two reference signals.

As has been described above, according to the present invention, the transistor to serve as the amplifying circuit is operated in a single-ended manner by using the balun. This reduces noise occurrence by half the amount of noises for an amplifying circuit operated in a differential manner. As a result, the entire NF is restricted.

The amounts of current fed into the switching circuits and the transistors serving as and amplifying circuit are appropriate for respective NF and linearity, making it possible to adjust the performance of the entire circuit.

The amounts of current fed into the switching circuits are appropriate for respective NF and linearity, making it possible to adjust the performance of the entire circuit in a preferred manner.

The present invention is a frequency converter that downconverts an RF signal to a baseband frequency and that is applied to a receiving circuit of a terminal unit such as a wireless LAN transceiver.

The Embodiments herein described are to be considered in all respects as illustrative and not restrictive. The scope of the invention should be determined not by the Embodiments illustrated, but by the appended claims, and all changes which come within the meaning and range of equivalency of the appended claims are therefore intended to be embraced therein.

What is claimed is:

1. A frequency converter performing dual frequency conversion of a first signal by using two signals including a second signal and a third signal and performing dual frequency conversion of the first signal by using two signals including the second signal and a fourth signal, the frequency converter comprising:
   a first switching circuit for performing a first frequency conversion by mixing the first signal and the second signal;
   a second switching circuit for performing a second frequency conversion by mixing a signal output from the first switching circuit and the third signal;
   a third switching circuit for performing a second frequency conversion by mixing the signal output from the first switching circuit and the fourth signal; and
   a balun having input terminals and output terminals, wherein:
   the output terminals of the balun are coupled to input terminals of the first switching circuit; and
   the first signal is introduced via the input terminals of the balun;
   the balun comprises two inductors alternatively formed on a semiconductor substrate, one of the inductors forming an input-side inductor and the other inductor forming an output-side inductor; and
   the first switching circuit, the second switching circuit, and the balun are formed on the same semiconductor substrate.

2. The frequency converter according to claim 1, wherein the first signal is transferred to the first switching circuit in the form of a current signal.

3. The frequency converter according to claim 1, wherein a coupling point is provided at a center of the output-side inductor of the balun, and a current source for supplying current is coupled to the coupling point.

4. The frequency converter according to claim 1, wherein a coupling point is provided at a center of the output-side inductor of the balun, the coupling point being ground.

5. The frequency converter according to claim 1, wherein a current source for supplying current is coupled to each coupling point of the output terminals of the balun and the input terminals of the first switching circuit.

6. The frequency converter according to claim 1, further comprising a low-noise amplifier having input terminals and output terminals and performing input/output operations in a single-ended manner, wherein:
   the output terminals of the low-noise amplifier are coupled to the input-side inductor of the balun; and
   the first signal is introduced via the input terminals of the low-noise amplifier.

7. The frequency converter according to claim 1, wherein transistors forming the first switching circuit and transistors forming the second switching circuit and the third switching circuit are different in size.

8. A frequency converter performing dual frequency conversion of a first signal by using two signals including a second signal and a third signal and performing dual frequency conversion of the first signal by using two signals including the second signal and a fourth signal, the frequency converter comprising;
   a first switching circuit for performing a first frequency conversion by mixing the first signal and the second signal;
   a second switching circuit for performing a second frequency conversion by mixing a signal output from the first switching circuit and the third signal;
   a third switching circuit for performing a second frequency conversion by mixing the signal output from the first switching circuit and the fourth signal; and
   a balun having input terminals and output terminals, wherein:
   the output terminals of the balun are coupled to input terminals of the first switching circuit;
   the first signal is introduced via the input terminals of the balun; and
   a current source is coupled to each coupling point of the first switching circuit and the second switching circuit and to each coupling point of the first switching circuit and the third switching circuit.

9. The frequency converter according to claim 8, wherein the current source is formed of a transistor.

10. The frequency converter according to claim 9, wherein bias voltage application means for applying a bias voltage to a base of the transistor forming the current source is provided, and the bias voltage is adjustable.

11. A radio communication device comprising;
    an antenna; and
    a frequency converter for performing dual frequency conversion of a first signal received via the antenna, the dual frequency conversion performed by using two signals including a second signal and a third signal and by using two signals including the second signal and a fourth signal, the frequency converter comprising:
    a first switching circuit for performing a first frequency conversion by mixing the first signal and the second signal;
    a second switching circuit for performing a second frequency conversion by mixing a signal output from the first switching circuit and the third signal;
    a third switching circuit for performing a second frequency conversion by mixing the signal output from the first switching circuit and the fourth signal; and
    a balun having input terminals and output terminals, wherein:
    the output terminals of the balun are coupled to input terminals of the first switching circuit; and
    the first signal is introduced via the input terminals of the balun;
    the balun comprises two inductors alternately formed on a semiconductor substrate, one of the inductors forming an input-side inductor and the other inductor forming an output-side inductor; and
    the first switching circuit, the second switching circuit, and the balun are formed on the same semiconductor substrate.

* * * * *